(12) United States Patent
Li et al.

(10) Patent No.: US 12,520,670 B2
(45) Date of Patent: Jan. 6, 2026

(54) DISPLAY DEVICE AND METHOD FOR MANUFACTURING THE SAME

(71) Applicant: Samsung Display Co., LTD., Yongin-si (KR)

(72) Inventors: Xin Xing Li, Yongin-si (KR); Eun Hwa Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 371 days.

(21) Appl. No.: 18/218,713

(22) Filed: Jul. 6, 2023

(65) Prior Publication Data

US 2024/0121988 A1    Apr. 11, 2024

(30) Foreign Application Priority Data

Oct. 6, 2022  (KR) .................. 10-2022-0128196
Jan. 2, 2023  (KR) .................. 10-2023-0000169

(51) Int. Cl.
*H10K 59/122*    (2023.01)
*H10K 59/00*     (2023.01)
*H10K 59/12*     (2023.01)

(52) U.S. Cl.
CPC ....... *H10K 59/122* (2023.02); *H10K 59/1201* (2023.02); *H10K 59/771* (2023.02)

(58) Field of Classification Search
CPC ............ H10K 59/122; H10K 59/1201; H10K 59/8723; H10K 59/8731
See application file for complete search history.

(56) References Cited

U.S. PATENT DOCUMENTS

2025/0143152 A1*   5/2025   Chung ................. H10K 59/873

FOREIGN PATENT DOCUMENTS

| CN | 107331647 | A |   | 11/2017 |              |
|----|-----------|---|---|---------|--------------|
| CN | 107331647 | B |   | 7/2019  |              |
| CN | 114725179 | A | * | 7/2022  | ... H10K 50/805 |
| CN | 117858554 | A | * | 4/2024  | ... H10K 59/1201 |

* cited by examiner

*Primary Examiner* — Joseph L Williams
(74) *Attorney, Agent, or Firm* — CANTOR COLBURN LLP

(57) ABSTRACT

A display device includes a substrate, first electrodes disposed on the substrate, a pixel defining film covering edges of the first electrodes, a spacer disposed on the pixel defining film and disposed between the first electrodes, an organic layer disposed on the first electrodes, the pixel defining film, and the spacer; and a second electrode disposed on the organic layer. The organic layer includes a first common layer and a second common layer continuously disposed on the first electrodes, and the first common layer, the second common layer, and the second electrode do not overlap the spacer.

25 Claims, 22 Drawing Sheets

DISPLAY DEVICE AND METHOD FOR MANUFACTURING THE SAME

This application claims priority to Korean Patent Application No. 10-2022-0128196, filed on Oct. 6, 2022 and Korean Patent Application No. 10-2023-0000169, filed on Jan. 2, 2023, and all the benefits accruing therefrom under 35 U.S.C. § 119, the content of which in their entirety is herein incorporated by reference.

BACKGROUND

1. Field

The disclosure relates to a display device and a method for manufacturing the same.

2. Description of the Related Art

As the information society develops, the demand for display devices for displaying images is being increased and diversified. For example, display devices are being applied to various electronic devices such as smartphones, digital cameras, laptop computers, navigation devices, and smart televisions.

The display device may be a flat panel display device such as a liquid crystal display device, a field emission display device, or a light-emitting display device. The light-emitting display device includes an OLED including organic light-emitting elements, an in OLED including inorganic light-emitting elements such as inorganic semiconductors, and a micro light-emitting display device including micro light-emitting elements.

The organic emitting element may include two electrodes opposing each other and a light-emitting layer interposed between the two electrodes. The light-emitting layer receives electrons and holes from the two electrodes and recombines the electrons and the holes with each other to generate excitons, and may emit light while the generated excitons change from an excited state to a ground state.

Since light source such as a backlight unit is not desired in the organic emitting display device including the organic light-emitting elements, the organic emitting display device has low power consumption, may be lightweight and thin, and has high quality characteristics such as a wide viewing angle, high luminance and contrast, and a fast response speed, and accordingly, is attracting attention as the next-generation display device.

SUMMARY

Features of the disclosure provide a display device capable of improving a color change of a low gradation and color mixing by reducing a leakage current, and a method for manufacturing the same.

However, features of the disclosure are not restricted to those set forth herein. The above and other features of the disclosure will become more apparent to one of ordinary skill in the art to which the disclosure pertains by referencing the detailed description of the disclosure given below.

In an embodiment of the disclosure, a display device includes a substrate, first electrodes disposed on the substrate, a pixel defining film covering edges of the first electrodes, a spacer disposed on the pixel defining film and disposed between the first electrodes, an organic layer disposed on the first electrodes, the pixel defining film, and the spacer; and a second electrode disposed on the organic layer. The organic layer includes a first common layer and a second common layer continuously disposed on the first electrodes, and the first common layer, the second common layer, and the second electrode do not overlap the spacer.

In an embodiment, the spacer may be unitary with the pixel defining film and be disposed to protrude in a thickness direction of the pixel defining film.

In an embodiment, the spacer may not overlap the first electrodes.

In an embodiment, the first common layer may include a hole injection layer and a hole transport layer, and the second common layer may include an electron transport layer and an electron injection layer.

In an embodiment, the organic layer may include a light-emitting layer disposed between the first common layer and the second common layer and overlapping the first electrodes.

In an embodiment, an uppermost surface of each of the first common layer, the second common layer, and the second electrode may be aligned and coincide with an upper surface of the spacer.

In an embodiment, the display device may further include a passivation layer disposed on the second electrode. The passivation layer may not overlap an upper surface of the spacer.

In an embodiment, an uppermost surface of each of the first common layer, the second common layer, the second electrode, and the passivation layer may be aligned and coincide with the upper surface of the spacer.

In an embodiment, the display device may further include an encapsulation layer disposed on the passivation layer and including a first inorganic film, a second inorganic film, and an organic film disposed between the first inorganic film and the second inorganic film. The first inorganic film may contact the upper surface of the spacer.

In an embodiment, an uppermost surface of each of the first common layer, the second common layer, the second electrode, and the passivation layer may contact the first inorganic film.

In an embodiment of the disclosure, a display device includes a substrate, first electrodes disposed on the substrate, a pixel defining film covering edges of the first electrodes and defining a plurality of emission areas, a spacer disposed on the pixel defining film and disposed between emission areas adjacent to each other among the plurality of emission areas, an organic layer disposed on the first electrodes, the pixel defining film, and the spacer; and a second electrode disposed on the organic layer. The organic layer includes a first common layer and a second common layer continuously disposed on the first electrodes, and each of the first common layer, the second common layer, and the second electrode is separated on the spacer.

In an embodiment, the spacer may be disposed parallel to one side of the emission area, and a length of the spacer may be equal to a length of one side of the emission area.

In an embodiment, the number of spacers may be plural, and the spacers may surround the emission areas in a plan view, respectively.

In an embodiment, the plurality of emission areas may emit light of different colors, and the spacer may be disposed between the emission areas emitting the light of the different colors.

In an embodiment, the spacers may not overlap the plurality of emission areas, and be disposed to be spaced apart from each other.

In an embodiment, an uppermost surface of each of the first common layer, the second common layer, and the second electrode may be aligned and coincides with an upper surface of the spacer.

In an embodiment, the display device may further include a passivation layer disposed on the second electrode. The passivation layer may not overlap an upper surface of the spacer.

In an embodiment, an uppermost surface of each of the first common layer, the second common layer, the second electrode, and the passivation layer may be aligned and coincides with the upper surface of the spacer.

In an embodiment, the display device may further include an encapsulation layer disposed on the passivation layer and including a first inorganic film, a second inorganic film, and an organic film disposed between the first inorganic film and the second inorganic film. The first inorganic film may contact the upper surface of the spacer.

In an embodiment, an uppermost surface of each of the first common layer, the second common layer, the second electrode, and the passivation layer may contact the first inorganic film.

In an embodiment of the disclosure, a method for manufacturing a display device includes forming first electrodes on a substrate, forming a pixel defining film covering edges of the first electrodes and a spacer on the pixel defining film, forming an organic layer by sequentially stacking a first common layer, a light-emitting layer, and a second common layer on the first electrodes, the pixel defining film, and the spacer, forming a second electrode on the organic layer, forming a passivation layer on the second electrode, and aligning a polishing device on the substrate and polishing and removing the first common layer, the second common layer, the second electrode, and the passivation layer disposed in an area overlapping the spacer.

In an embodiment, the pixel defining film and the spacer may be simultaneously formed by applying an organic material layer on the substrate and using a halftone mask.

In an embodiment, the first common layer, the second common layer, the second electrode, and the passivation layer may be continuously formed on the first electrodes, and the passivation layer, the second electrode, the second common layer, and the first common layer may be sequentially polished and removed by the polishing device.

In an embodiment, polishing may be stopped when the polishing device reaches the spacer.

In an embodiment, the polishing may be a chemical mechanical polishing ("CMP") process.

With a display device in an embodiment, by separating common layers of an organic layer in an area in which a spacer is disposed, the movement of charges to adjacent emission areas may be reduced. Accordingly, as a length of a path of a leakage current through each common layer increases, a resistance also increases, such that an amount of the leakage current may be reduced. Accordingly, color mixing between the emission areas adjacent to each other may be improved.

The effects of the disclosure are not limited to the aforementioned effects, and various other effects are included in the specification.

BRIEF DESCRIPTION OF THE DRAWINGS

The above and other features and features of the disclosure will become more apparent by describing in detail embodiments thereof with reference to the attached drawings, in which.

DETAILED DESCRIPTION

The disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments will be described with reference to the accompanying drawings.

Figure 1A:
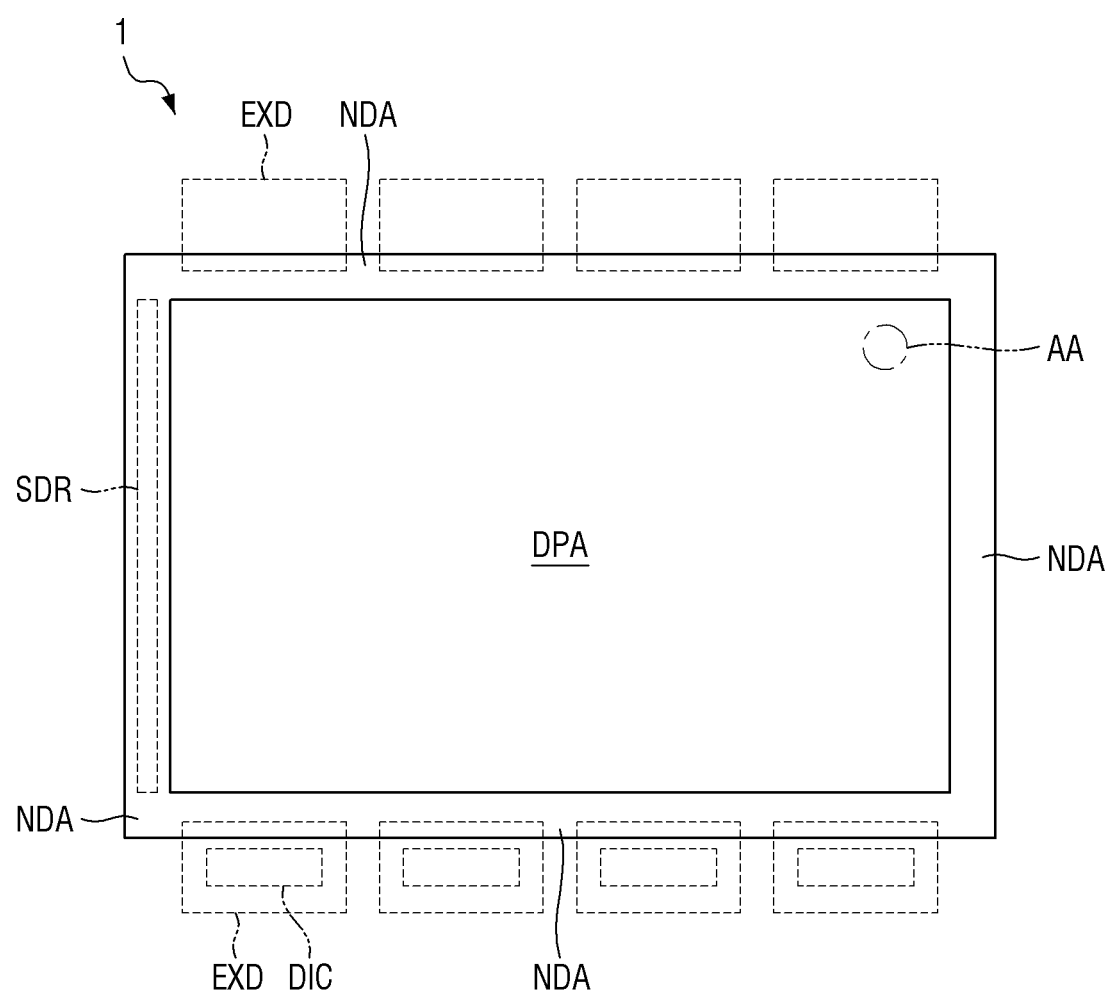
FIG. 1A is a plan view of an embodiment of a display device.

FIG. 1A is a plan view of an embodiment of a display device, and FIG. 2A is an enlarged view of a portion AA of FIG. 1A.

Figure 1B:
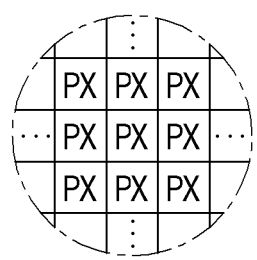
FIG. 1B is an enlarged view of a portion AA of FIG. 1A.

Referring to FIGS. 1A and 1B, a display device 1 in an embodiment may be applied to smartphones, mobile phones, tablet personal computers ("PCs"), personal digital assistants, portable multimedia players ("PMPs"), televisions, game machines, wrist watch-type electronic devices, head-mounted displays, monitors of personal computers, laptop computers, vehicle navigation systems, vehicle instrument boards, digital cameras, camcorders, external billboards, electric signs, medical devices, inspection devices, various home appliances such as refrigerators and washing machines, or Internet of Things ("IoT") devices. In the specification, a television ("TV") will be described as an embodiment of the display device, and the TV may have high resolution or ultra-high resolution such as high definition ("HD"), ultra-high definition ("UHD"), 4K, or 8K.

In addition, the display device 1 in an embodiment may be variously classified according to a display method. In an embodiment, classification of the display device may include an organic light-emitting display ("OLED"), an inorganic light-emitting display ("inorganic EL"), a quantum dot light-emitting display ("QED"), a micro LED display ("micro-LED"), a nano LED display ("nano-LED"), a plasma display panel ("PDP"), a field emission display ("FED"), a cathode ray tube display ("CRT"), a liquid crystal display ("LCD"), an electrophoretic display ("EPD"), or the like, for example. Hereinafter, an OLED will be described as an embodiment of the display device, and unless a special distinction is desired, an OLED applied to an embodiment will be simply abbreviated as a display device. However, the disclosure is not limited to the OLED, and other display devices listed above or known in the technical field may also be applied within the scope of the technical idea.

The display device 1 in an embodiment may have a quadrate shape in a plan view, e.g., a rectangular shape. When the display device 1 is a television, the display device 1 is arranged so that long sides thereof are disposed in a transverse direction. However, the disclosure is not limited thereto, and the long sides of the display device 1 may be disposed in a longitudinal direction or the display device 1 may be rotatably installed, such that the long sides of the display device 1 may be variably disposed in the transverse or longitudinal direction.

The display device 1 may include a display area DPA and non-display areas NDA. The display area DPA may be an active area in which an image is displayed. The display area DPA may have a quadrangular (e.g., rectangular) shape in a plan view, similar to the overall shape of the display device 1, but is not limited thereto.

The display area DPA may include a plurality of pixels PX. The plurality of pixels PX may be arranged in a matrix direction. A shape of each pixel PX may be a quadrangular (e.g., rectangular shape or a square) shape in a plan view. In an embodiment, a shape of each pixel PX may also be a rhombic shape of which each side is inclined with respect to one side direction of the display device 1. The plurality of pixels PX may include several color pixels PX. In an embodiment, the plurality of pixels PX may include first color pixels PX, which are red pixels, second color pixels PX, which are green pixels, and third color pixels PX, which are blue pixels, for example, but are not limited thereto. The respective color pixels PX may be alternately arranged in a stripe type or a PenTile™ type.

The non-display areas NDA may be disposed around the display area DPA. The non-display areas NDA may entirely or partially surround the display area DPA. The display area DPA may have a quadrangular (e.g., rectangular) shape, and the non-display areas NDA may be disposed adjacent to four sides of the display area DPA. The non-display areas NDA may constitute a bezel of the display device 1.

Driving circuits or driving elements driving the display area DPA may be disposed in the non-display areas NDA. In an embodiment, a pad part may be provided on a substrate of the display device 1 in a first non-display area NDA disposed adjacent to a first long side (lower side in FIG. 1A) of the display device 1 and a second non-display area NDA disposed adjacent to a second long side (upper side in FIG. 1A) of the display device 1, and external devices EXD may be disposed (e.g., mounted) on pad electrodes of the pad part. In embodiments, the external devices EXD may include a connection film, a printed circuit board, a driving chip DIC, a connector, a line connection film, or the like. A scan driver SDR or the like formed directly on the display substrate of the display device 1 may be disposed in a third non-display area NDA disposed adjacent to a first short side (left side in FIG. 1A) of the display device 1.

Figure 2:
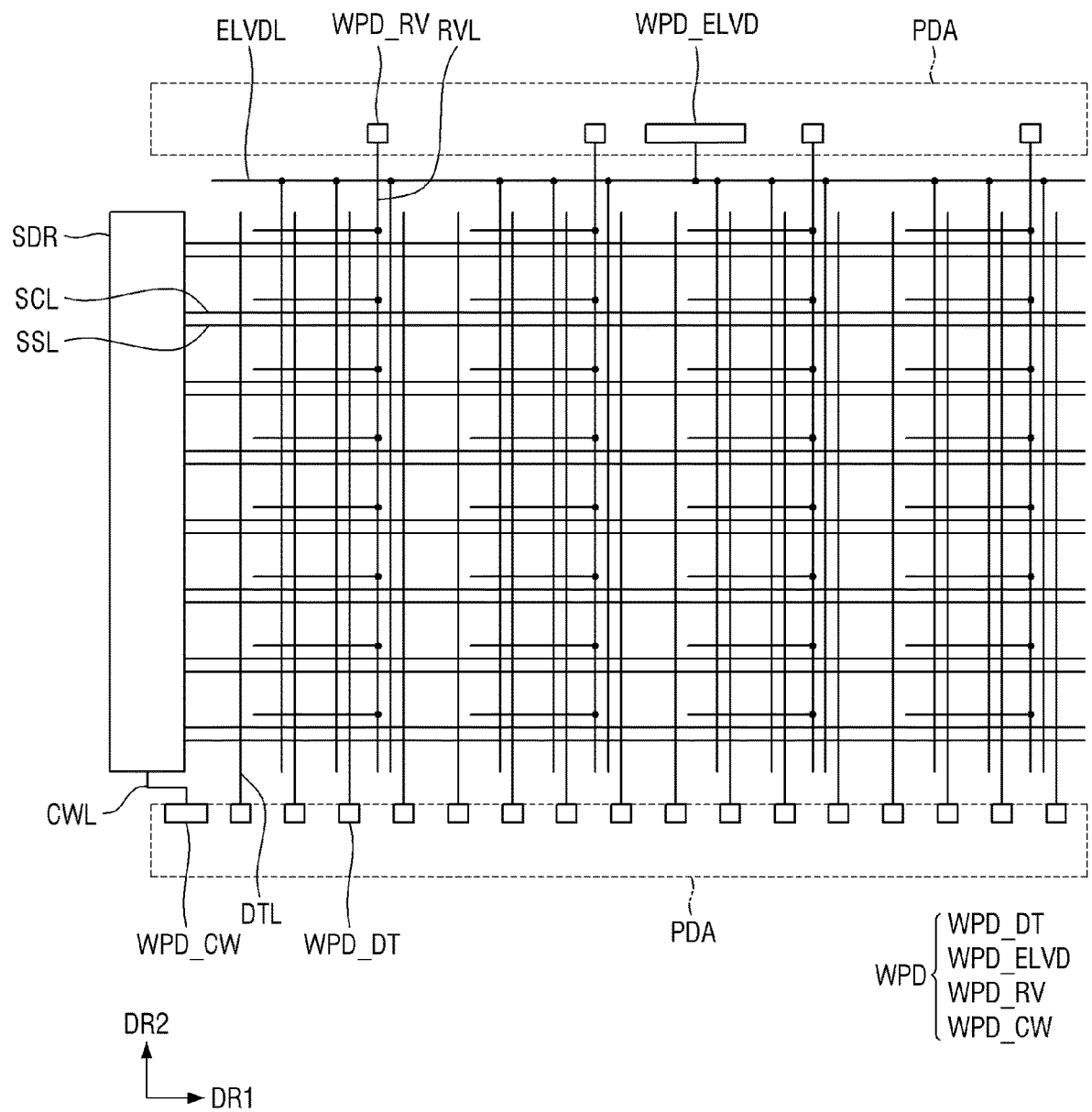
FIG. 2 is a schematic layout diagram of an embodiment of a circuit of a substrate of the display device.

FIG. 2 is a schematic layout diagram of an embodiment of a circuit of a substrate of the display device.

Referring to FIG. 2, a plurality of lines are disposed on a substrate. The plurality of lines may include scan lines SCL, sensing signal lines SSL, data lines DTL, reference voltage lines RVL, and a first power line ELVDL.

The scan lines SCL and the sensing signal lines SSL may extend in a first direction DR1. The scan lines SCL and the sensing signal lines SSL may be connected to the scan driver SDR. The scan driver SDR may include a driving circuit including or consisting of a circuit layer CCL. The scan driver SDR may be disposed in the third non-display area NDA on the substrate, but is not limited thereto, and may be disposed in a fourth non-display area NDA or be disposed in both the third non-display area NDA and the fourth non-display area NDA. The scan driver SDR may be connected to a signal connection line CWL, and at least one end of the signal connection line CWL may be connected to the external device EXD (refer to FIG. 1A) by forming a pad WPD_CW on the first non-display area NDA and/or the second non-display area NDA.

The data lines DTL and the reference voltage lines RVL may extend in a second direction DR2 crossing the first direction DR1. The first power line ELVDL may include portions extending in the second direction DR2. The first power line ELVDL may further include portions extending in the first direction DR1. The first power line ELVDL may have a mesh structure, but is not limited thereto.

Wiring pads WPD may be disposed at at least one ends of the data lines DTL, the reference voltage lines RVL, and the first power line ELVDL. Each wiring pad WPD may be disposed in a pad part PDA of the non-display area NDA. In an embodiment, wiring pads WPD_DT (hereinafter, also referred to as 'data pads') of the data lines DTL may be disposed in a pad part PDA of the first non-display area NDA, and wiring pads WPD RV (hereinafter, also referred to as 'reference voltage pads') of the reference voltage lines RVL and a wiring pad WPD_ELVD (hereinafter, also referred to as a 'first power pad') of the first power line ELVDL may be disposed in a pad part PDA of the second non-display area NDA. In another embodiment, all of the data pads WPD_DT, the reference voltage pads WPD RV, and the first power pad WPD_ELVD may be disposed in the same area, e.g., the first non-display area NDA. As described above, the external device EXD (refer to FIG. 1A) may be disposed (e.g., mounted) on the wiring pad WPD. The external device EXD may be disposed (e.g., mounted) on the wiring pad WPD through an anisotropic conductive film, ultrasonic bonding, or the like.

Each pixel PX on the substrate includes a pixel driving circuit. The lines described above may apply driving signals to the respective pixel driving circuits while passing through the respective pixels PX or around the respective pixels PX. The pixel driving circuit may include a transistor and a capacitor. The numbers of transistors and capacitors in each pixel driving circuit may be variously modified. Hereinafter, the pixel driving circuit will be described using a 3T1C structure in which the pixel driving circuit includes three transistors and one capacitor in an embodiment, but the disclosure is not limited thereto, and structures of various other modified pixels PX such as a 2T1C structure, a 7T1C structure, and a 6T1C structure may also be applied.

Figure 3:
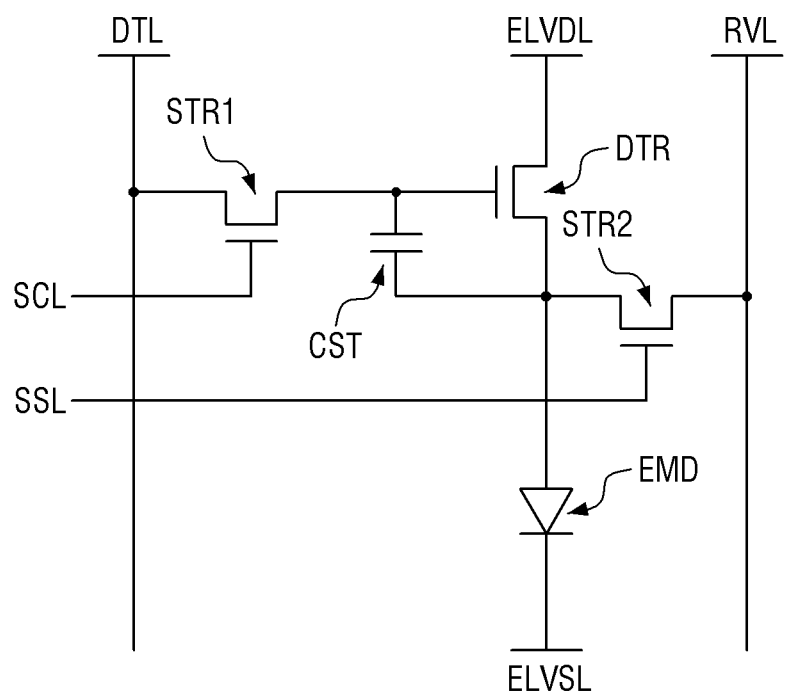
FIG. 3 is an equivalent circuit diagram of an embodiment of one pixel of the display device.

FIG. 3 is an equivalent circuit diagram of an embodiment of one pixel of the display device.

Referring to FIG. 3, each pixel PX of the display device in an embodiment includes three transistors DTR, STR1, and STR2 and one storage capacitor CST, in addition to a light-emitting element EMD.

The light-emitting element EMD emits light according to a current supplied through a driving transistor DTR. The light-emitting element EMD may be implemented as an organic light-emitting diode, a micro light-emitting diode, a nano light-emitting diode, or the like.

A first electrode (i.e., an anode electrode) of the light-emitting element EMD may be connected to a source electrode of the driving transistor DTR, and a second electrode (i.e., a cathode electrode) of the light-emitting element EMD may be connected to a second power line ELVSL to which a low potential voltage (second source voltage) lower than a high potential voltage (first source voltage) of a first power line ELVDL is supplied.

The driving transistor DTR adjusts a current flowing from the first power line ELVDL to which the first source voltage is supplied to the light-emitting element EMD according to a voltage difference between a gate electrode and the source electrode thereof. The gate electrode of the driving transistor DTR may be connected to a first source/drain electrode of a first switching transistor STR1, the source electrode of the driving transistor DTR may be connected to the first electrode of the light-emitting element EMD, and a drain electrode of the driving transistor DTR may be connected to the first power line (also referred to as a first source voltage line) ELVDL to which the first source voltage is applied.

The first switching transistor STR1 is turned on by a scan signal of a scan line SCL to connect a data line DTL to the gate electrode of the driving transistor DTR. A gate electrode of the first switching transistor STR1 may be connected to the scan line SCL, the first source/drain electrode of the first switching transistor STR1 may be connected to the gate electrode of the driving transistor DTR1, and a second source/drain electrode of the first switching transistor STR1 may be connected to the data line DTL.

A second switching transistor STR2 is turned on by a sensing signal of a sensing signal line SSL to connect a reference voltage line RVL to the source electrode of the driving transistor DTR. A gate electrode of the second switching transistor STR2 may be connected to the sensing signal line SSL, a first source/drain electrode of the second switching transistor STR2 may be connected to the reference voltage line RVL, and a second source/drain electrode of the second switching transistor STR2 may be connected to the source electrode of the driving transistor DTR.

In an embodiment, the first source/drain electrode of each of the first and second switching transistors STR1 and STR2 may be a source electrode, and the second source/drain electrode of each of the first and second switching transistors STR1 and STR2 may be a drain electrode, but the disclosure is not limited thereto, and vice versa.

The storage capacitor CST is formed between the gate electrode and the source electrode of the driving transistor DTR. The storage capacitor CST stores a difference voltage between a gate voltage and a source voltage of the driving transistor DTR.

The driving transistor DTR and the first and second switching transistors STR1 and STR2 may be formed as thin film transistors. In addition, it has been mainly described in FIG. 3 that the driving transistor DTR and the first and second transistors STR1 and STR2 are N-type metal oxide semiconductor field effect transistors ("MOSFETs"), but the disclosure is not limited thereto. That is, the driving transistor DTR and the first and second switching transistors STR1 and STR2 may be P-type MOSFETs or some of the driving transistor DTR and the first and second switching transistors STR1 and STR2 may be N-type MOSFETs and the others of the driving transistor DTR and the first and second switching transistors STR1 and STR2 may be P-type MOSFETs.

Figure 4:
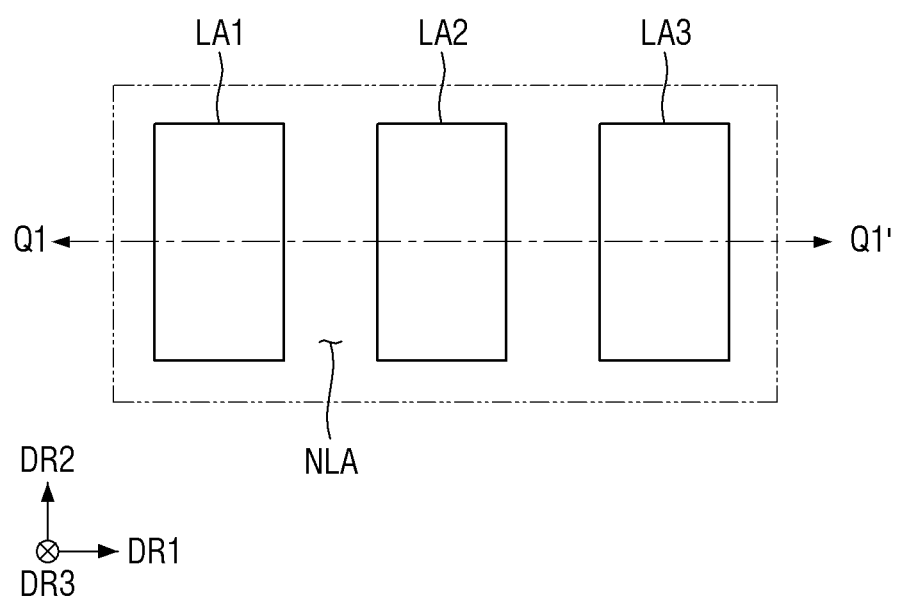
FIG. 4 is a plan view illustrating an embodiment of a pixel of an organic light-emitting display device.

FIG. 4 is a plan view illustrating an embodiment of a pixel of an OLED.

Referring to FIG. 4, a plurality of emission areas LA1, LA2, and LA3 and a non-emission area NLA may be defined on the substrate in the display area DPA. In some embodiments, the plurality of emission areas LA1, LA2, and LA3 of the display area DPA may include a first emission area LA1, a second emission area LA2, and a third emission area LA3. The first emission area LA1, the second emission area LA2, and the third emission area LA3 may be areas in which light generated by light-emitting elements of the substrate is emitted to the outside, and the non-emission area NLA may be an area in which light is not emitted to the outside.

In some embodiments, lights emitted from the first emission area LA1, the second emission area LA2, and the third emission area LA3 to the outside may be lights of different colors. In an embodiment, the first emission area LA1 may emit light of a first color, the second emission area LA2 may emit light of a second color, and the third emission area LA3 may emit light of a third color, for example. Here, the light of the first color may be blue light having a peak wavelength in the range of about 440 nanometers (nm) to about 480 nm. The light of the second color may be red light having a peak wavelength in the range of about 610 nm to about 650 nm. The light of the third color may be green light having a peak wavelength in the range of about 510 nm to about 550 nm.

However, the disclosure is not limited thereto, and the light of the second color may be green light and the light of the third color may be red light.

In some embodiments, the first emission area LA1, the second emission area LA2, and the third emission area LA3 may form one group, and a plurality of groups may be defined in the display area DPA.

In some embodiments, as illustrated in FIG. 4, the first emission area LA1, the second emission area LA2, and the third emission area LA3 may be sequentially disposed along one direction. In some embodiments, in the display area DPA, the first emission area LA1, the second emission area LA2, and the third emission area LA3 may form one group and be repeatedly disposed.

However, the disclosure is not limited thereto, and an arrangement of the first emission area LA1, the second emission area LA2, and the third emission area LA3 may be variously changed.

Figure 5:
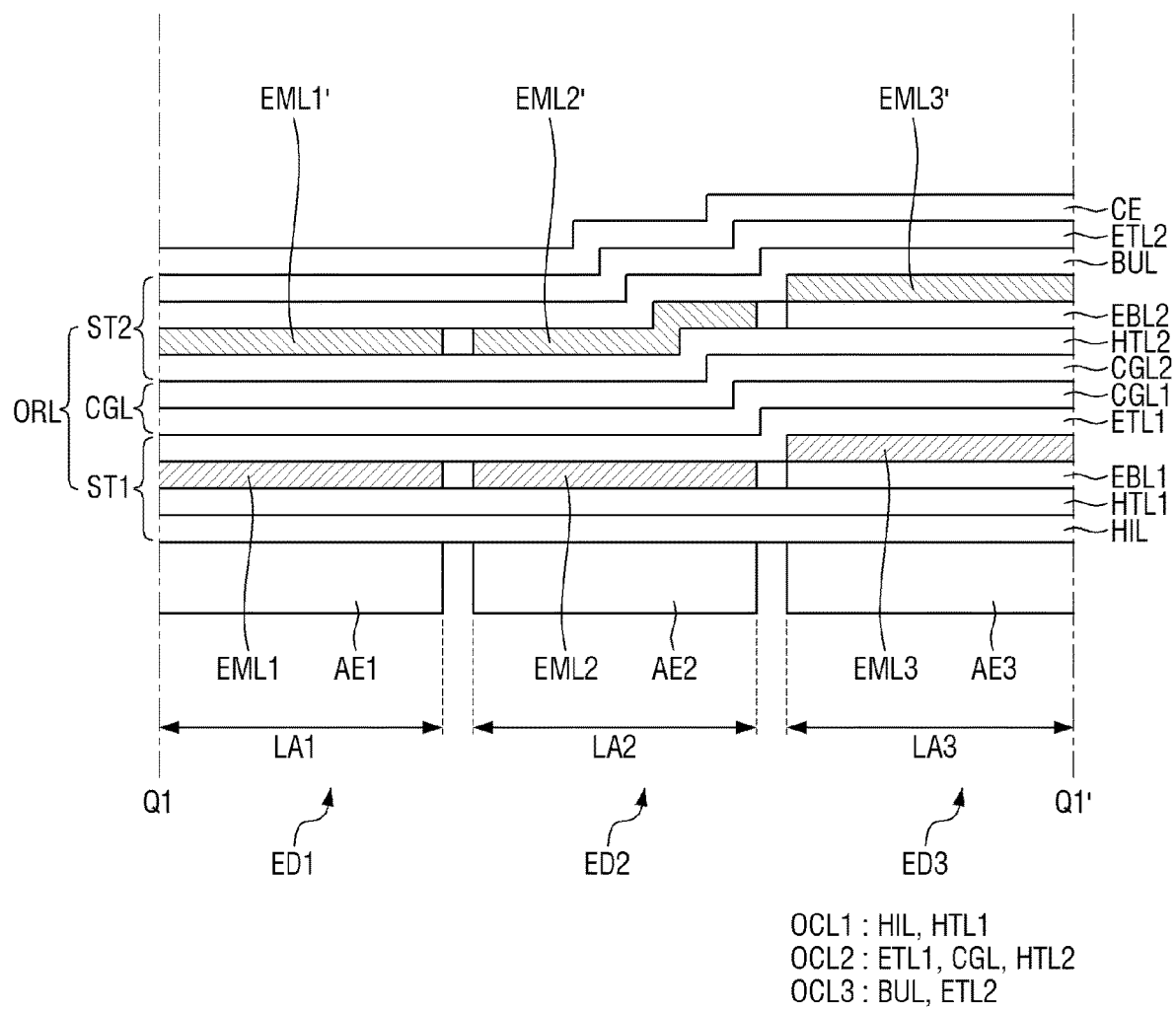
FIG. 5 is a cross-sectional view taken along line Q1-Q1' of FIG. 4.

FIG. 5 is a cross-sectional view taken along line Q1-Q1' of FIG. 4. FIG. 5 schematically illustrates anode electrodes AE, an organic layer ORL, and a cathode electrode CE of organic light-emitting elements ED1, ED2, and ED3 disposed on the display device 1.

Referring to FIG. 5, anode electrodes AE1, AE2, and AE3 may be disposed in the first emission area LA1, the second emission area LA2, and the third emission area LA3, respectively. A first anode electrode AE1 may be disposed to overlap the first emission area LA1, a second anode electrode AE2 may be disposed to overlap the second emission area LA2, and a third anode electrode AE3 may be disposed to overlap the third emission area LA3.

In some embodiments, the first anode electrode AE1, the second anode electrode AE2, and the third anode electrode AE3 may be reflective electrodes. In this case, the first anode electrode AE1, the second anode electrode AE2, and the third anode electrode AE3 may be metal layers including a metal such as Ag, Mg, Al, Pt, Pd, Au, Ni, Nd, Ir, and Cr. In another embodiment, the first anode electrode AE1, the second anode electrode AE2, and the third anode electrode AE3 may further include metal oxide layers stacked on the metal layers. In an embodiment, the first anode electrode AE1, the second anode electrode AE2, and the third anode electrode AE3 may have a multilayer structure, e.g., a two-layer structure such as indium tin oxide ("ITO")/Ag, Ag/ITO, ITO/Mg, or ITO/MgF$_2$, or a three-layer structure such as ITO/Ag/ITO.

In some embodiments, the organic layer ORL may have a structure in which a plurality of light-emitting layers are disposed to overlap each other, e.g., a tandem structure. In an embodiment, the organic layer ORL may include a first stack ST1 including lower light-emitting layers EML1, EML2, and EML3, a second stack ST2 disposed on the first stack ST1 and including upper light-emitting layers EML1', EML2', and EML3', and a charge generation layer CGL disposed between the first stack ST1 and the second stack ST2. The first stack ST1 and the second stack ST2 may be disposed to overlap each other, for example.

The lower light-emitting layers EML1, EML2, and EML3 and the upper light-emitting layers EML1', EML2', and EML3' may be disposed to overlap each other, respectively.

In some embodiments, a first lower light-emitting layer EML1 and a first upper light-emitting layer EML1' may emit the light of the first color, e.g., the blue light. A second lower light-emitting layer EML2 and a second upper light-emitting layer EML2' may emit the light of the second color, e.g., the red light. A third lower light-emitting layer EML3 and a third upper light-emitting layer EML3' may emit the light of the third color, e.g., the green light. That is, emitted light finally emitted from the organic layer ORL may be the blue light in the first emission area LA1, be the red light in the second emission area LA2, and be green light in the third emission area LA3.

In some embodiments, each of the first lower light-emitting layer EML1 and the first upper light-emitting layer EML1' emitting the blue light may include a host and a dopant. The host is not particularly limited as long as it is a commonly used material, but may be tris(8-hydroxyquinolino)aluminum (Alq3), 4,4'-bis(N-carbazolyl)-1,1'-biphenyl ("CBP"), poly(n-vinylcabazole) ("PVK"), 9,10-di(naphthalene-2-yl)anthracene ("ADN"), 4,4',4"-Tris(carbazol-9-yl)-triphenylamine ("TCTA"), 1,3,5-tris(N-phenylbenzimidazole-2-yl)benzene (TPBi), 3-tert-butyl-9,10-di(naphth-2-yl) anthracene ("TBADN"), distyrylarylene ("DS A"), 4,4'-bis (9-carbazolyl)-2,2"-dimethyl-biphenyl ("CDBP"), 2-Methyl-9,10-bis(naphthalen-2-yl)anthracene ("MADN"), or the like.

In addition, the first lower light-emitting layer EML1 and the first upper light-emitting layer EML1' emitting the blue light may include, e.g., a fluorescent material including any one of spiro-DPVBi, spiro-6P, distyryl-benzene ("DSB"), distyryl-arylene ("DSA"), polyfluorene ("PFO")-based polymer, and poly(p-phenylene vinylene) ("PPV")-based polymer. In another embodiment, the first lower light-emitting layer EML1 and the first upper light-emitting layer EML1' may include a phosphorescent material including an organometallic complex such as (4,6-F2ppy)2Irpic.

In some embodiments, the second lower light-emitting layer EML2 and the second upper light-emitting layer EML2' emitting the red light may include or consist of a phosphorescent material including a host material including carbazole biphenyl ("CBP") or 1,3-bis (carbazol-9-yl) ("mCP") and including a dopant including at least one of bis(1-phenylisoquinoline)acetylacetonate iridium (PIQIr(acac)), bis(1-phenylquinoline)acetylacetonate iridium (PQIr (acac)), tris(1-phenylquinoline)iridium (PQIr), and platinum octaethylporphyrin (PtOEP) or may include or consist of a fluorescent material including PBD: Eu(DBM)$_3$(Phen) or perylene, but are not limited thereto.

In some embodiments, the third lower light-emitting layer EML3 and the third upper light-emitting layer EML3' emitting the green light may include or consist of a phosphorescent material including a host material including CBP or mCP and including a dopant including fac-tris(2-phenylpyridine)iridium (Ir(ppy)3) or include or consist of a fluorescent material including tris(8-hydroxyquinolino)aluminum (Alq3), but are not limited thereto.

The charge generation layer CGL may be disposed between the first stack ST1 and the second stack ST2. The charge generation layer CGL may serve to inject charges into each light-emitting layer. The charge generation layer CGL may serve to adjust a charge balance between the first stack ST1 and the second stack ST2. The charge generation layer CGL may include an n-type charge generation layer CGL1 and a p-type charge generation layer CGL2. The p-type charge generation layer CGL2 may be disposed on the n-type charge generation layer CGL1, and may be disposed between the n-type charge generation layer CGL1 and the second stack ST2.

The charge generation layer CGL may have a junction structure between the n-type charge generation layer CGL1 and the p-type charge generation layer CGL1. The n-type charge generation layer CGL1 may be disposed more adjacent to the anode electrodes AE1, AE2, and AE3 among the anode electrodes AE1, AE2, and AE3 and the cathode electrode CE. The p-type charge generation layer CGL2 is disposed more adjacent to the cathode electrode CE among the anode electrodes AE1, AE2, and AE3 and the cathode electrode CE. The n-type charge generation layer CGL1 supplies electrons to the lower light-emitting layers EML1, EML2, and EML3 adjacent to the anode electrodes AE1, AE2, and AE3, and the p-type charge generation layer CGL2 supplies holes to the upper light-emitting layers EML1', EML2', and EML3' included in the second stack ST2. The charge generation layer CGL may be disposed between the first stack ST1 and the second stack ST2 to provide charges to the respective light-emitting layers, thereby increasing luminous efficiency and decreasing a driving voltage.

The first stack ST1 may be disposed on the first anode electrode AE1, the second anode electrode AE2, and the third anode electrode AE3, and may further include a first hole transport layer HTL1, a first electron block layer EBL1, and a first electron transport layer ETL1.

The first hole transport layer HTL1 may be disposed on each of the first anode electrode AE1, the second anode electrode AE2, and the third anode electrode AE3. The first hole transport layer HTL1 may serve to smoothly transport holes and may include a hole transport material. The hole transport material may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine ("TPD") and TCTA, N,N'-di(1-naphthyl)-N,N'-diphenylbenzidine ("NPB"), 4.4'-cyclohexylidene bis[N,N-bis(4-methylphenyl)benzenamine] ("TAPC"), or the like, but is not limited thereto.

The first electron block layer EBL1 may be disposed on the first hole transport layer HTL1, and may be disposed between the first hole transport layer HTL1 and the lower light-emitting layers EML1, EML2, and EML3. The first electron block layer EBL1 may include a hole transport material and a metal or a metal compound so as to prevent electrons generated in the lower light-emitting layers EML1, EML2, and EML3 from flowing into the first hole transport layer HTL1. In some embodiments, the first hole transport layer HTL1 and the first electron block layer EBL1 described above may be formed as a single layer in which respective materials are mixed with each other.

The first electron transport layer ETL1 may be disposed on the lower light-emitting layers EML1, EML2, and EML3, and may be disposed between the charge generation layer CGL and the lower light-emitting layers EML1, EML2, and EML3. In some embodiments, the first electron transport layer ETL1 may include an electron transport material such as tris(8-hydroxyquinolinato)aluminum (Alq3), 1,3,5-tri (1-phenyl-1H-benzo[d]imidazol-2-yl)phenyl (TPBi), 2,9-dimethyl-4,7-diphenyl-1,10-phenanthroline ("BCP"), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole (tBu-PBD), bis(2-methyl-8-quinolinolato-N1, O8)-(1,1'-biphenyl-4-olato)aluminum (BAlq), berylliumbis (benzoquinolin-10-olate (Bebq2), ADN, and combinations thereof. However, the disclosure is not limited to the type of the electron transport material described above.

The second stack ST2 may be disposed on the charge generation layer CGL, and may further include a second hole transport layer HTL2, a second electron block layer EBL2, a buffer layer BUL, and a second electron transport layer ETL2.

The second hole transport layer HTL2 may be disposed on the charge generation layer CGL. The second hole transport layer HTL2 may include or consist of the same material as that of the first hole transport layer HTL1, or may include one or more materials selected from the materials exemplified as the material included in the first hole transport layer HTL1. The second hole transport layer HTL2 may be formed as a single layer or be formed as a plurality of layers.

The second electron block layer EBL2 may be disposed on the second hole transport layer HTL2, and may be disposed between the second hole transport layer HTL2 and the upper light-emitting layers EML1', EML2', and EML3'. The second electron block layer EBL2 may include or consist of the same material as that of the first electron block layer EBL1 and may have the same structure as the first electron block layer EBL1, or may include one or more materials selected from the materials exemplified as the material included in the first electron block layer EBL1.

The second electron transport layer ETL2 may be disposed on the upper light-emitting layers EML1', EML2', and EML3', and may be disposed between the upper light-emitting layers EML1', EML2', and EML3' and the cathode electrode CE. The second electron transport layer ETL2 may include or consist of the same material as that of the first electron transport layer ETL1 and may have the same structure as the first electron transport layer ETL1, or may include one or more materials selected from the materials exemplified as the material included in the first electron transport layer ETL1. The second electron transport layer ETL2 may be formed as a single layer or be formed as a plurality of layers.

The buffer layer BUL may be disposed between the upper light-emitting layers EML1', EML2', and EML3' and the second electron transport layer ETL2. The buffer layer BUL may prevent holes from flowing from the upper light-emitting layers EML1', EML2', and EML3' into the cathode electrode CE. The buffer layer BUL may include a material having hole characteristics, e.g., a hole transport layer material, but is not limited thereto.

Although not illustrated in FIG. 5, a hole injection layer may be further disposed in at least one of an area between the first stack ST1 and the first to third anode electrodes AE1, AE2, and AE3 and an area between the second stack ST2 and the charge generation layer CGL. The hole injection layer may serve to more smoothly inject holes into the lower light-emitting layers EML1, EML2, and EML3 and the upper light-emitting layers EML1', EML2', and EML3'. In some embodiments, the hole injection layer may include or consist of one or more of cupper phthalocyanine (CuPc), poly(3,4)-ethylenedioxythiophene ("PEDOT"), polyaniline ("PANI"), and N,N-dinaphthyl-N,N'-diphenylbenzidine ("NPD"), but is not limited thereto.

In addition, although not illustrated in FIG. 5, an electron injection layer may be further disposed in at least one of an area between the second electron transport layer ETL2 and the cathode electrode CE and an area between the charge generation layer CGL and the first stack ST1. The electron injection layer may serve to smoothly inject electrons, and may include or consist of tris(8-hydroxyquinolino)aluminum (Alq3), PBD, TAZ, Spiro-PBD, BAlq, or SAlq, but is not limited thereto. In addition, the electron injection layer may include a metal halide compound, e.g., one or more of $MgF_2$, LiF, NaF, KF, RbF, CsF, FrF, LiI, NaI, KI, RbI, CsI, FrI, and $CaF_2$, but is not limited thereto. In addition, the electron injection layer may include a lanthanum-based material such as Yb, Sm, or Eu. In an alternative embodiment, the electron injection layer may include both a metal halide material and a lanthanum-based material such as RbI:Yb or KI:Yb. When the electron injection layer includes both the metal halide material and the lanthanum-based material, the electron injection layer may be formed by co-deposition of the metal halide material and the lanthanum-based material.

The cathode electrode CE may be disposed on the organic layer ORL described above. The cathode electrode CE may have transflective properties or transmissive properties. When the cathode electrode CE has the transflective properties, the cathode electrode CE may include Ag, Mg, Cu, Al, Pt, Pd, Au, Ni, Nd, Ir, Cr, Li, Ca, LiF/Ca, LiF/Al, Mo, Ti or compounds or combinations thereof, e.g., a combination of Ag and Mg. In addition, when a thickness of the cathode electrode CE is several tens to several hundreds of angstroms, the cathode electrode CE may have the transflective properties.

When the cathode electrode CE has the transmissive properties, the cathode electrode CE may include transparent conductive oxide ("TCO"). In an embodiment, the cathode electrode CE may include tungsten oxide ($W_xO_y$), titanium oxide ($TiO_2$), ITO, indium zinc oxide ("IZO"), zinc oxide (ZnO), indium tin zinc oxide ("ITZO"), magnesium oxide (MgO), or the like, for example.

The first anode electrode AE1, the organic layer ORL, and the cathode electrode CE may constitute a first organic light-emitting element ED1, the second anode electrode AE2, the organic layer ORL, and the cathode electrode CE may constitute a second organic light-emitting element ED2, and the third anode electrode AE3, the organic layer ORL, and the cathode electrode CE may constitute a third organic light-emitting element ED3. Each of the first organic light-emitting element (also referred to as a first light-emitting element) ED1, the second organic light-emitting element (also referred to as a second light-emitting element) ED2, and the third organic light-emitting element (also referred to as a third light-emitting element) ED3 may emit emitted light. In an embodiment, the first light-emitting element ED1 may emit the blue light, the second light-emitting element ED2 may emit the red light, and the third light-emitting element ED3 may emit the green light, for example.

In FIG. 5, the charge generation layer CGL may be a common layer extending and continuously disposed in the plurality of emission areas. In an embodiment, in FIG. 5, the charge generation layer CGL may be a common layer continuously disposed in the first emission area LA1, the second emission area LA2, and the third emission area LA3, for example. In addition, the hole injection layer HIL, the first hole transport layer HTL1, the first electron transport layer ETL1, the second hole transport layer HTL2, the buffer layer BUL, and the second electron transport layer ETL2 may also common layers extending and continuously disposed in the plurality of emission areas. Hereinafter, for convenience of explanation, the hole injection layer HIL and the first hole transport layer HTL1 will be also referred to as a first common layer OCL1, the charge generation layer CGL, the first electron transport layer ETL1, and the second hole transport layer HTL2 will be also referred to as a second common layer OCL2, and the buffer layer BUL and the second electron transport layer ETL2 will be also referred to as a third common layer OCL3.

The common layers described above may serve to transfer electrons and holes contributing to substantial light emission. The common layers act as paths through which charges (electrons and holes) generated in adjacent emission areas are transferred to adjacent emission areas, such that a leakage current may be generated. In this case, light is emitted by the leakage current in an emission area in which light should not be emitted, such that color combination may occur or an unwanted gradation may be expressed.

The illustrated embodiment discloses a display device capable of reducing a leakage current and improving color mixing and gradation expression characteristics by increasing a length of a movement path of charges by partially short-circuiting the common layers between the respective emission areas, and a method for manufacturing the same.

Figure 6:
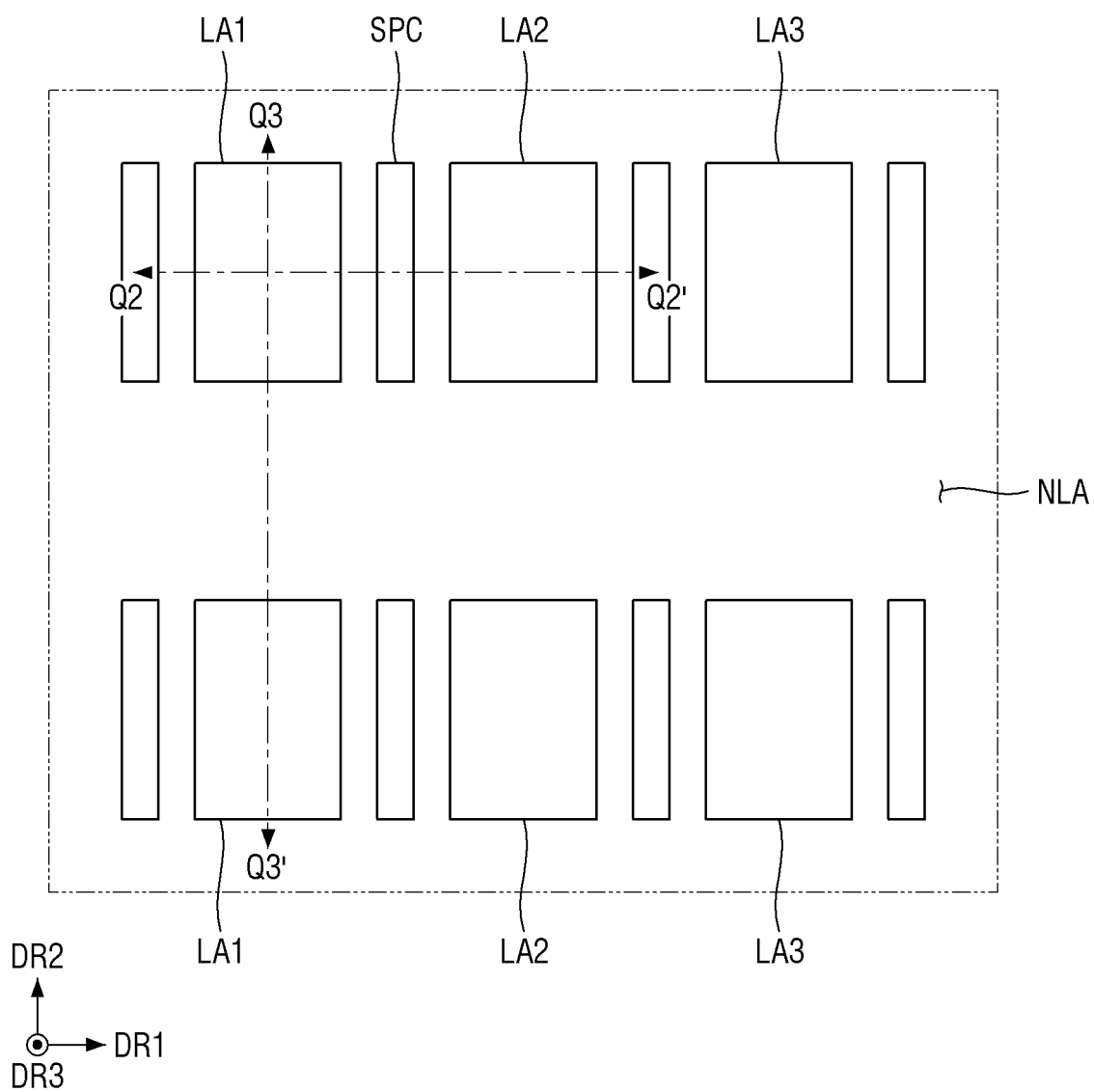
FIG. 6 is a plan view illustrating an embodiment of emission areas of the display device.
Figure 7:
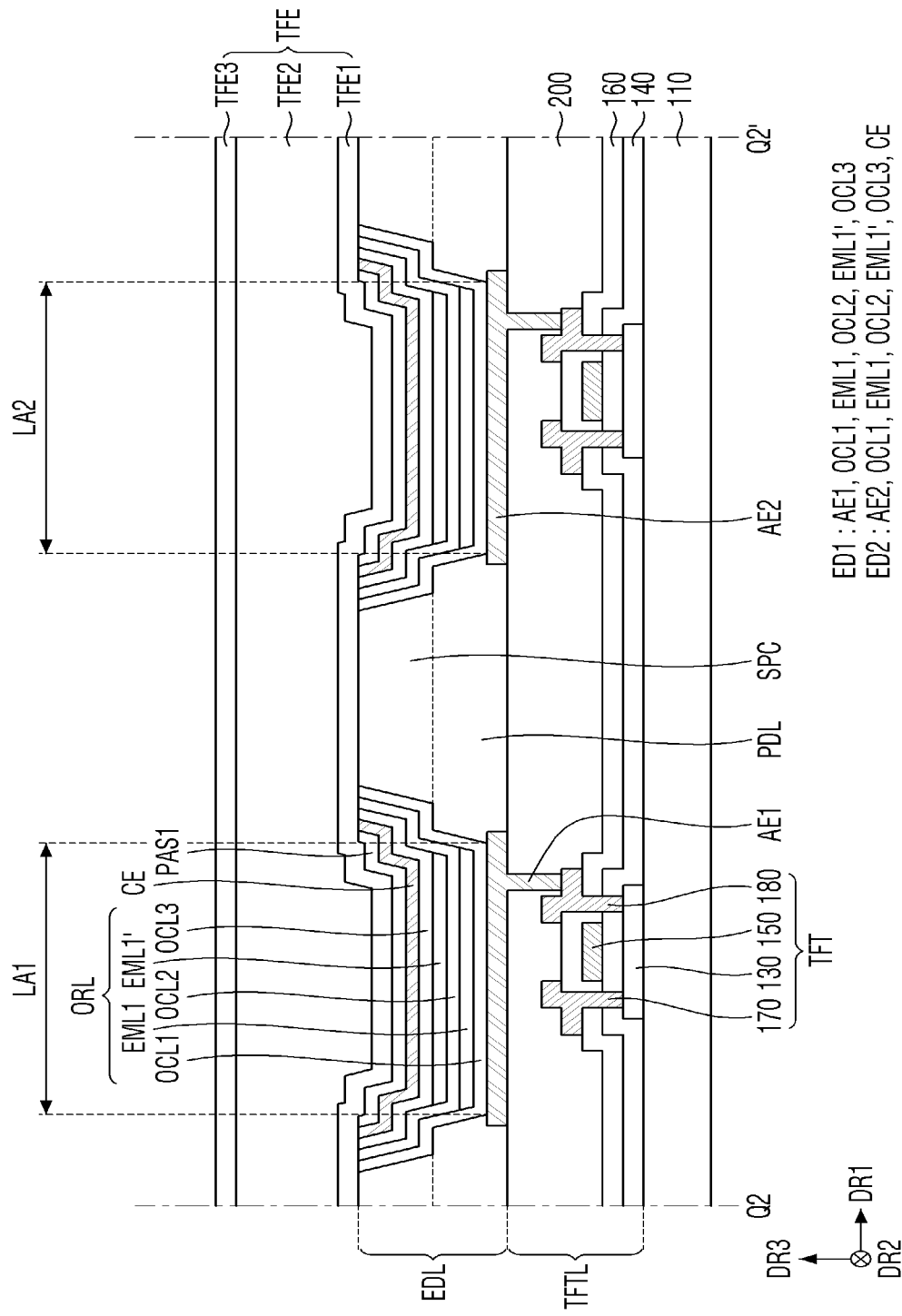
FIG. 7 is a cross-sectional view taken along line Q2-Q2' of FIG. 6.
Figure 8:
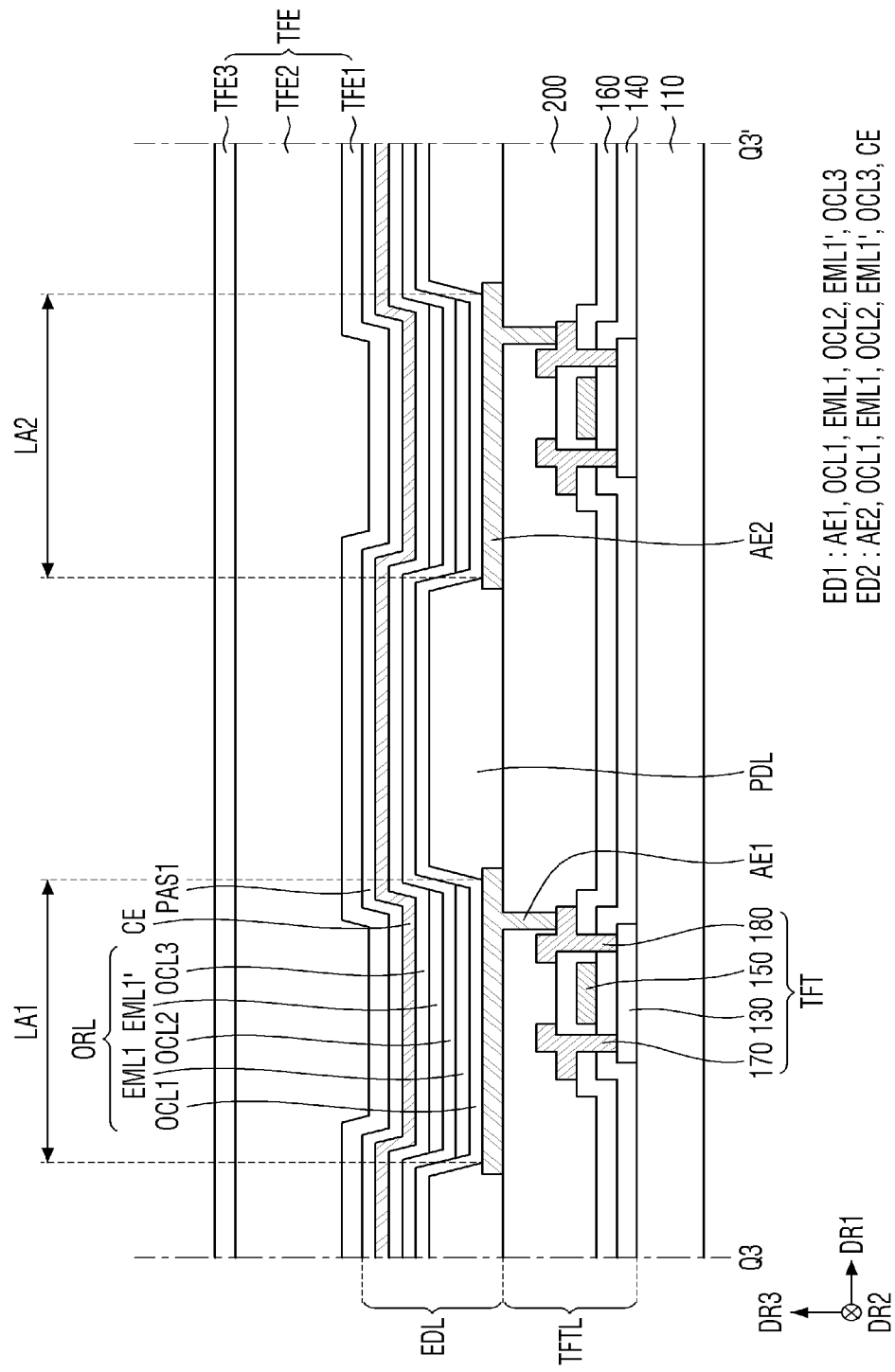
FIG. 8 is a cross-sectional view taken along line Q3-Q3' of FIG. 6.
Figure 9:
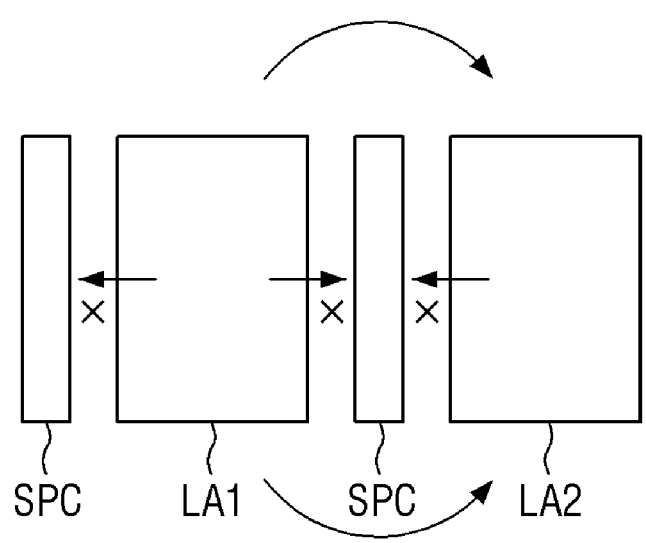
FIG. 9 is a schematic view illustrating charge movement between the emission areas.

FIG. 6 is a plan view illustrating an embodiment of emission areas of the display device. FIG. 7 is a cross-sectional view taken along line Q2-Q2' of FIG. 6. FIG. 8 is a cross-sectional view taken along line Q3-Q3' of FIG. 6. FIG. 9 is a schematic view illustrating charge movement between the emission areas.

FIG. 6 illustrates a structure of the pixel of FIG. 4 described above in an embodiment, and FIG. 7 illustrates a cross-sectional structure between the first emission area LA1 and the second emission area LA2 as an example. FIG. 8 illustrates a cross-sectional structure between the first emission areas LA1 and the second emission areas LA2 as an example.

Referring to FIGS. 6 to 8, the display device 1 in an embodiment may include first emission areas LA1, second emission areas LA2, and third emission areas LA3. The first emission areas LA1, the second emission areas LA2, and the third emission areas LA3 may be grouped and repeatedly disposed. A non-emission area NLA may be disposed in an area other than the first emission areas LA1, the second emission areas LA2, and the third emission areas LA3. An arrangement of the respective emission areas has been described above, and a description thereof will thus be omitted.

In an embodiment, spacers SPC may be disposed between the respective emission areas LA1, LA2, and LA3.

The spacers SPC may be disposed between the respective emission areas LA1, LA2, and LA3 so as not to overlap the emission areas LA1, LA2, and LA3. The spacers SPC may be disposed in the non-emission area NLA so as to overlap the anode electrodes AE1 and AE2 disposed in the emission areas LA1, LA2, and LA3 in a third direction DR3. In an embodiment, the spacers SPC may be disposed between emission areas adjacent to each other among the emission areas LA1, LA2, and LA3. In an embodiment, the spacers SPC may be disposed between the first emission area LA1 and the second emission area LA2 adjacent to each other in the first direction DR1 and between the second emission area LA2 and the third emission area LA3 adjacent to each other in the first direction DR1, for example. That is, the spacers SPC may be disposed between the adjacent emission areas to which charges easily move through the common layers to separate the common layers.

At least one spacer SPC may be disposed between the respective emission areas LA1, LA2, and LA3. In an embodiment, one spacer SPC may be disposed between the first emission area LA1 and the second emission area LA2, for example. The spacer SPC disposed between the first emission area LA1 and the second emission area LA2 may be disposed parallel to at least one sides of the adjacent first emission area LA1 and/or second emission area LA2. In addition, the spacer SPC may be disposed parallel to at least one side of each of the anode electrodes AE1, AE2, and AE3 (refer to FIG. 5).

The spacer SPC may have a length measured in the second direction DR2, and the length of the spacer SPC may be equal to a length of at least one side of each of the emission areas LA1, LA2, and LA3. In an embodiment, the length of the spacer SPC may be equal to a length of the first emission area LA1 or the second emission area LA2 measured in the second direction DR2, for example. However, the disclosure is not limited thereto, and the length of the spacer SPC in the second direction DR2 may also be greater than the length of the first emission area LA1 or the second emission area LA2 in the second direction DR2. In addition, the length of the spacer SPC may be greater than or equal to a length of at least one side of each of the anode electrodes AE1, AE2, and AE3. In an embodiment, the length of the spacer SPC measured in the second direction DR2 may be greater than or equal to a length of the first anode electrode AE1 measured in the second direction DR2, for example.

It has been illustrated and described in the drawings that the spacers SPC are disposed between the first emission area LA1 and the second emission area LA2 and between the second emission area LA2 and the third emission area LA3, but the disclosure is not limited thereto, and the spacer SPC may be omitted between the first emission area LA1 and the second emission area LA2 or between the second emission area LA2 and the third emission area LA3. In addition, the spacer SPC may also be omitted between emission areas emitting the same color. In an embodiment, the spacer SPC may be omitted between first emission areas LA1 disposed in an opposite direction to the second direction DR2, for example.

More specifically, referring to FIG. 7, the display device 1 in an embodiment may include a substrate 110, and a thin film transistor layer TFTL and a light-emitting element layer EDL disposed on the substrate 110.

The substrate 110 may be a rigid substrate or be a flexible substrate that may be bent, folded, and rolled. The substrate 110 may include or consist of an insulating material such as glass, quartz, or a polymer resin. In embodiments, the polymer resin may include polyethersulphone ("PES"), polyacrylate ("PA"), polyarylate ("PAR"), polyetherimide ("PEI"), polyethylene naphthalate ("PEN"), polyethylene terepthalate ("PET"), polyphenylene sulfide ("PPS"), polyallylate, polyimide ("PI"), polycarbonate ("PC"), cellulose triacetate ("CAT"), cellulose acetate propionate ("CAP"), or combinations thereof. The substrate 110 may also include a metal material.

The thin film transistor layer TFTL may be disposed on the substrate 110. The thin film transistor layer TFTL may include thin film transistors TFT, a gate insulating layer 140, an inter-insulating layer 160, and a planarization layer 200.

The thin film transistor TFT may be disposed on the substrate 110. The thin film transistor TFT may include an active layer 130, a gate electrode 150, a source electrode 170 and a drain electrode 180. It has been illustrated in FIG. 7 that the thin film transistor TFT is formed in a top gate type in which the gate electrode 150 is disposed above the active layer 130, but the disclosure is not limited thereto. That is, the thin film transistor TFT may be formed in a bottom gate type in which the gate electrode 150 is disposed below the active layer 130 or a double gate type in which the gate electrode 150 is disposed both above and below the active layer 130.

The active layer 130 may be disposed on the substrate 110. The active layer 130 may include polycrystalline silicon, single crystal silicon, an oxide semiconductor, or the like. When the active layer includes the oxide semiconductor, the active layer 130 may include a plurality of conductive regions and a channel region disposed between the plurality of conductive regions. The oxide semiconductor may be an oxide semiconductor including or consisting of indium (In). In an embodiment, the oxide semiconductor may be ITO, IZO, indium gallium oxide ("IGO"), indium zinc tin oxide ("IZTO"), indium gallium tin oxide ("IGTO"), indium gallium zinc tin oxide ("IGZTO"), or the like, for example.

In another embodiment, the active layer 130 may include polycrystalline silicon. The polycrystalline silicon may be formed by crystallizing amorphous silicon. In this case, each of the conductive regions of the active layer 130 may be a doped region doped with impurities.

A light-blocking layer for blocking external light incident on the active layer 130 may be further disposed between the substrate 110 and the active layer 130. When the light-blocking layer is disposed, the light-blocking layer may be disposed to overlap the active layer 130, and may include or consist of an opaque metal material blocking transmission of light.

The gate insulating layer 140 may be formed on the active layer 130. The gate insulating layer 140 may be disposed on the substrate 110 as well as on the active layer 130. The gate insulating layer 140 may be formed as an inorganic film, e.g., an inorganic layer including silicon oxide ($SiO_2$), silicon nitride (SiN), or silicon oxynitride (SiON), or may be formed in a structure in which such inorganic layers are stacked.

The gate electrode 150 may be disposed on the gate insulating layer 140. A gate line and one electrode of the storage capacitor may be further disposed in the same layer as the gate electrode 150. The gate electrode 150 may be disposed to overlap the active layer 130 in a thickness direction. The gate electrode 150 may be formed as a single layer or multiple layers including any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto.

The inter-insulating layer 160 may be disposed on the gate electrode 150. The inter-insulating layer 160 may function as an insulating film between the gate electrode 150 and other layers disposed thereon. In addition, the inter-insulating layer 160 may be disposed to cover the gate electrode 150 to serve to protect the gate electrode 130. The inter-insulating layer 160 may be formed as an inorganic layer including an inorganic material, e.g., silicon oxide ($SiO_2$), silicon nitride (SiN), or silicon oxynitride (SiON), or may be formed in a structure in which such inorganic layers are stacked.

The source electrode 170 and the drain electrode 180 may be disposed on the inter-insulating layer 160. Each of the source electrode 170 and the drain electrode 180 may be connected to the active layer 130 through contact holes penetrating through the gate insulating layer 140 and the inter-insulating layer 160. The source electrode 170 and the drain electrode 180 may be formed as a single layer or multiple layers including any one of molybdenum (Mo), aluminum (Al), chromium (Cr), gold (Au), titanium (Ti), nickel (Ni), neodymium (Nd), and copper (Cu), or alloys thereof. However, the disclosure is not limited thereto. Accordingly, the thin film transistor TFT including the active layer 130, the gate electrode 150, the source electrode 170, and the drain electrode 180 may be disposed.

The planarization layer 200 may be disposed on the source electrode 170 and the drain electrode 180 in order to planarize a step due to the thin film transistor TFT. The planarization layer 200 may include contact holes through which the anode electrodes AE1 and AE2 of the light-emitting elements ED1 and ED2 are connected to the thin film transistor TFT. The planarization layer 200 may include an organic material such as an acrylic resin, an epoxy resin, a phenolic resin, a polyamide resin, and a polyimide resin and perform a surface planarization function.

Although not illustrated, a buffer layer may be further disposed between the substrate 110 and the thin film transistor layer TFTL. The buffer layer may be disposed on the substrate 110 in order to protect the thin film transistors TFT and the light-emitting elements ED1 and ED2 from moisture permeating through the substrate 110 vulnerable to moisture permeation. The buffer layer may include a plurality of inorganic films that are alternately stacked. In an embodiment, the buffer layer may be multiple films in which one or more inorganic films including silicon oxide ($SiO_2$), silicon nitride (SiN), and silicon nitride (SiON) are alternately stacked, for example.

The light-emitting element layer EDL may be disposed on the planarization layer 200. The light-emitting element layer EDL may include the light-emitting elements ED1 and ED2 and a pixel defining film PDL. The light-emitting elements ED1 and ED2 may include the anode electrodes AE1 and AE2, the organic layer ORL, and the cathode electrode CE. In an embodiment, the first light-emitting element ED1 may include the first anode electrode AE1, the organic layer ORL, and the cathode electrode CE, and the second light-emitting element ED2 may include the second anode electrode AE2, the organic layer ORL, and the cathode electrode CE, for example.

The anode electrodes AE1 and AE2 may act as pixel electrodes or first electrodes and may be connected to the drain electrodes 180 of the thin film transistors TFT through the contact holes of the planarization layer 200. The anode electrodes AE1 and AE2 may be reflective electrodes reflecting light emitted from the organic layer ORL. In an embodiment, each of the anode electrodes AE1 and AE2 may include a transparent conductive material layer such as ITO, IZO, or ITZO, and a reflective layer disposed below the transparent conductive material layer, for example. The reflective layer may include, e.g., a metal material having high reflectivity such as aluminum (Al), silver (Ag), titanium (Ti), or an APC alloy. The APC alloy is an alloy of silver (Ag), palladium (Pd), and copper (Cu). The anode electrodes AE1 and AE2 may include or consist of, e.g., ITO/Al/ITO or ITO/APC/ITO.

The pixel defining film PDL may be disposed to cover edges of the anode electrodes AE1 and AE2 on the planarization layer 200 in order to partition the respective emission areas LA1 and LA2. The pixel defining film PDL may include an organic material such as an acrylic resin, an epoxy resin, a phenolic resin, a polyamide resin, and a polyimide resin and also perform a surface planarization function.

The spacer SPC may be disposed on the pixel defining film PDL. The spacer SPC may protrude in the third direction DR3 on the pixel defining film PDL. The spacer SPC may be disposed to overlap the pixel defining film PDL in the third direction DR3 and not overlap the emission areas LA1 and LA2. An arrangement of the spacer SPC has been described above, and a description thereof will thus be omitted.

The spacer SPC may include an organic material such as an acrylic resin, an epoxy resin, a phenolic resin, a polyamide resin, or a polyimide resin. The spacer SPC may include or consist of the same material as that of the pixel defining film PDL, and may be formed simultaneously with the pixel defining film PDL through the same process as the pixel defining film PDL. However, the disclosure is not limited thereto, and the spacer SPC may be separately formed on the pixel defining film PDL.

The organic layer ORL may be disposed on the anode electrodes AE1 and AE2 and the pixel defining film PDL. The organic layer ORL may include the hole injection layer HIL, the first hole transport layer HTL1, the first electron block layer EBL1, the charge generation layer CGL, the second hole transport layer HTL2, the second electron block layer EBL2, the buffer layer BUL, and the second electron transport layer ETL2, as illustrated in FIG. 5. In the first emission area LA1, the first lower light-emitting layer EML1 may be disposed between the first electron block layer EBL1 and the charge generation layer CGL, and the first upper light-emitting layer EML1' may be disposed between the second electron block layer EBL2 and the second electron transport layer ETL2. In the second emission area LA2, the second lower light-emitting layer EML2 may be disposed between the first electron block layer EBL1 and the charge generation layer CGL, and the second upper light-emitting layer EML2' may be disposed between the second electron block layer EBL2 and the second electron transport layer ETL2. In FIG. 7, the hole injection layer HIL and the first hole transport layer HTL1 are represented as a first common layer OCL1, the charge generation layer CGL, the first electron transport layer ETL1, and the second hole transport layer HTL2 are represented as a second common layer OCL2, and the buffer layer BUL and the second electron transport layer ETL2 are represented as a third common layer OCL3.

The first common layer OCL1 of the organic layer ORL may be disposed to be in direct contact with the anode electrodes AE1 and AE2, the pixel defining film PDL, and the spacer SPC. The first common layer OCL1, the second common layer OCL2, and the third common layer OCL3 may be disposed to be separated on the spacer SPC. In an embodiment, the first common layer OCL1, the second common layer OCL2, and the third common layer OCL3 may be disposed in each of the first emission area LA1 and the second emission area LA2, but may be disposed to be separated on the spacer SPC disposed between the first emission area LA1 and the second emission area LA2, for example. The first common layer OCL1, the second common layer OCL2, and the third common layer OCL3 may be disposed so as not to overlap an upper surface of the spacer SPC in the third direction DR3.

In addition, as illustrated in FIG. 8, the first common layer OCL1, the second common layer OCL2, and the third common layer OCL3 may be disposed on the pixel defining film PDL in an area in which the spacer SPC is not disposed. In an embodiment, the first common layer OCL1 may be disposed to be in direct contact with the entirety of an upper surface of the pixel defining film PDL, for example. The first common layer OCL1, the second common layer OCL2, and the third common layer OCL3 may be continuously disposed between the first emission areas LA1.

As described above, the first common layer OCL1, the second common layer OCL2, and the third common layer OCL3 may be separated, respectively, in an area in which the spacer SPC is disposed, and thus, the movement of charges to adjacent emission areas LA1 and LA2 may be reduced. That is, when a length of a path of a leakage current through each of the common layers OCL1, OCL2, and OCL3 increases, a resistance also increases, such that an amount of the leakage current may be reduced. Accordingly, the movement of charges between the first emission area LA1 and the second emission area LA2 adjacent to each other may be reduced, such that color mixing between the emission areas may be improved.

The cathode electrode CE may be disposed on the organic layer ORL. The cathode electrode CE may be formed to cover the organic layer ORL. The cathode electrode CE may be a cathode electrode injecting electrons into the light-emitting elements ED1 and ED2 and may be a second electrode. In addition, the cathode electrode CE may be a common layer formed in common in the respective light-emitting elements ED1 and ED2.

The cathode electrode CE may be disposed to be separated on the spacer SPC. In an embodiment, the cathode electrode CE may be disposed in each of the first emission area LA1 and the second emission area LA2, but may be disposed to be separated on the spacer SPC disposed between the first emission area LA1 and the second emission area LA2, for example. The cathode electrode CE may be disposed so as not to overlap the upper surface of the spacer SPC in the third direction DR3.

In addition, as illustrated in FIG. 8, the cathode electrode CE may be disposed on the pixel defining film PDL so as to overlap the pixel defining film PDL in the area in which the spacer SPC is not disposed. In an embodiment, the cathode electrode CE may be continuously disposed between adjacent first emission areas LA1, for example.

The cathode electrode CE may be separated in the area in which the spacer SPC is disposed, but may be continuously disposed in the area in which the spacer SPC is not disposed to act as a common electrode.

Referring to FIG. 9, in the display device in an embodiment, the first common layer OCL1, the second common layer OCL2, the third common layer OCL3, and the cathode electrode CE may be separated by disposing the spacer SPC between the respective emission areas LA1 and LA2. Accordingly, a leakage current may be reduced by reducing the movement of charges through the first common layer OCL1, the second common layer OCL2, and the third common layer OCL3 in a portion where the spacer SPC is disposed. In an area in which the spacer SPC is not disposed between the respective emission areas LA1 and LA2, the first common layer OCL1, the second common layer OCL2, the third common layer OCL3, and the cathode electrode CE may be continuously disposed and serve as common layers. As a result, by separating the first common layer OCL1, the second common layer OCL2, and the third common layer OCL3 described above between the emission areas LA1 and LA2, resistances may be increased, and accordingly, the movement of charges to the adjacent emission areas through the first common layer OCL1, the second common layer OCL2, and the third common layer OCL3 may be reduced to improve gradation expression and color mixing.

A passivation layer PAS1 may be disposed on the light-emitting element layer EDL. The passivation layer PAS1 may serve to protect the light-emitting element layer EDL disposed therebeneath. The passivation layer PAS1 may be formed as an inorganic layer including an inorganic material, e.g., silicon oxide ($SiO_2$), silicon nitride (SiN), or silicon oxynitride (SiON), or may be formed in a structure in which such inorganic layers are stacked.

The passivation layer PAS1 may be disposed to be separated on the spacer SPC. In an embodiment, the passivation layer PAS1 may be disposed in each of the first emission area LA1 and the second emission area LA2, but may be disposed to be separated on the spacer SPC disposed between the first emission area LA1 and the second emission area LA2, for example. The passivation layer PAS1 may be disposed so as not to overlap the upper surface of the spacer SPC in the third direction DR3. In addition, as illustrated in FIG. 8, the passivation layer PAS1 may be disposed so as to overlap the pixel defining film PDL in the area in which the spacer SPC is not disposed. The passivation layer PAS1 may be continuously disposed between the first emission areas LA1.

The uppermost surface of the passivation layer PAS1 may be aligned and coincide with the uppermost surface of each of the first common layer OCL1, the second common layer OCL2, the third common layer OCL3, and the cathode electrode CE described above. As described later, after the passivation layer PAS1 is stacked, the first common layer OCL1, the second common layer OCL2, the third common layer OCL3, the cathode electrode CE, and the passivation layer PAS1 may be polished through a polishing process. Accordingly, the uppermost surface of the passivation layer PAS1 may be formed to be aligned and coincide with the uppermost surface of each of the first common layer OCL1, the second common layer OCL2, the third common layer OCL3, and the cathode electrode CE described above. In addition, the uppermost surfaces of the first common layer OCL1, the second common layer OCL2, the third common layer OCL3, the cathode electrode CE, and the passivation layer PAS1 may be aligned and coincide with the uppermost surface of the spacer SPC.

An encapsulation layer TFE may be disposed on the passivation layer PAS1. The encapsulation layer TFE may include at least one inorganic film in order to prevent oxygen or moisture from permeating into the light-emitting element layer EDL. In addition, the encapsulation layer TFE may include at least one organic film in order to protect the light-emitting element layer EDL from foreign substances such as dust. In an embodiment, the encapsulation layer TFE may include a first inorganic film TFE1, an organic film TFE2, and a second inorganic film TFE3, for example.

The first inorganic film TFE1 may be disposed on the passivation layer PAS1 and the spacer SPC, the organic film TFE2 may be disposed on the first inorganic film TFE1, and the second inorganic film TFE3 may be disposed on the organic film TFE2. The first inorganic film TFE1 may be disposed to be in direct contact with the upper surface of the spacer SPC. The first inorganic film TFE1 and the second inorganic film TFE3 may be formed as multiple films in which one or more inorganic films of a silicon nitride layer, a silicon oxynitride layer, a silicon oxide layer, a titanium oxide layer, and an aluminum oxide layer are alternately stacked. The organic film TFE2 may include or consist of a monomer.

In an embodiment, the first common layer OCL1, the second common layer OCL2, the third common layer OCL3, the cathode electrode CE, and the passivation layer PAS1 may be disposed to contact the first inorganic film TFE1. In an embodiment, the uppermost surface of each the first common layer OCL1, the second common layer OCL2, the third common layer OCL3, the cathode electrode CE, and the passivation layer PAS1 may be disposed to contact the first inorganic film TFE1, for example.

The first emission area LA1 and the second emission area LA2 have been illustrated and described in FIGS. 7 and 8, but the disclosure is not limited thereto, and the above description may also be equally applied to the third emission area LA3. In addition, it has been described in FIGS. 7 and 8 that the first to third common layers OCL1, OCL2, and OCL3, the cathode electrode CE, and the passivation layer PAS1 are separated on the spacer SPC, but the disclosure is not limited thereto. In another embodiment, the passivation layer PAS1 may not be separated on the spacer SPC, and in another embodiment, the cathode electrode CE and the passivation layer PAS1 may not be separated on the spacer SPC. This may be achieved by adjusting the order of performing a polishing process to be described later.

FIGS. 10 to 13 are plan views illustrating emission areas and spacers of display devices according to other embodiments, respectively.

Each of other embodiments of FIGS. 10 to 13 is different from an embodiment of FIGS. 6 to 8 in an arrangement of spacers. Hereinafter, a description of contents overlapping those of the above-described embodiment will be omitted, and contents different from those of the above-described embodiment will be described.

Figure 10:
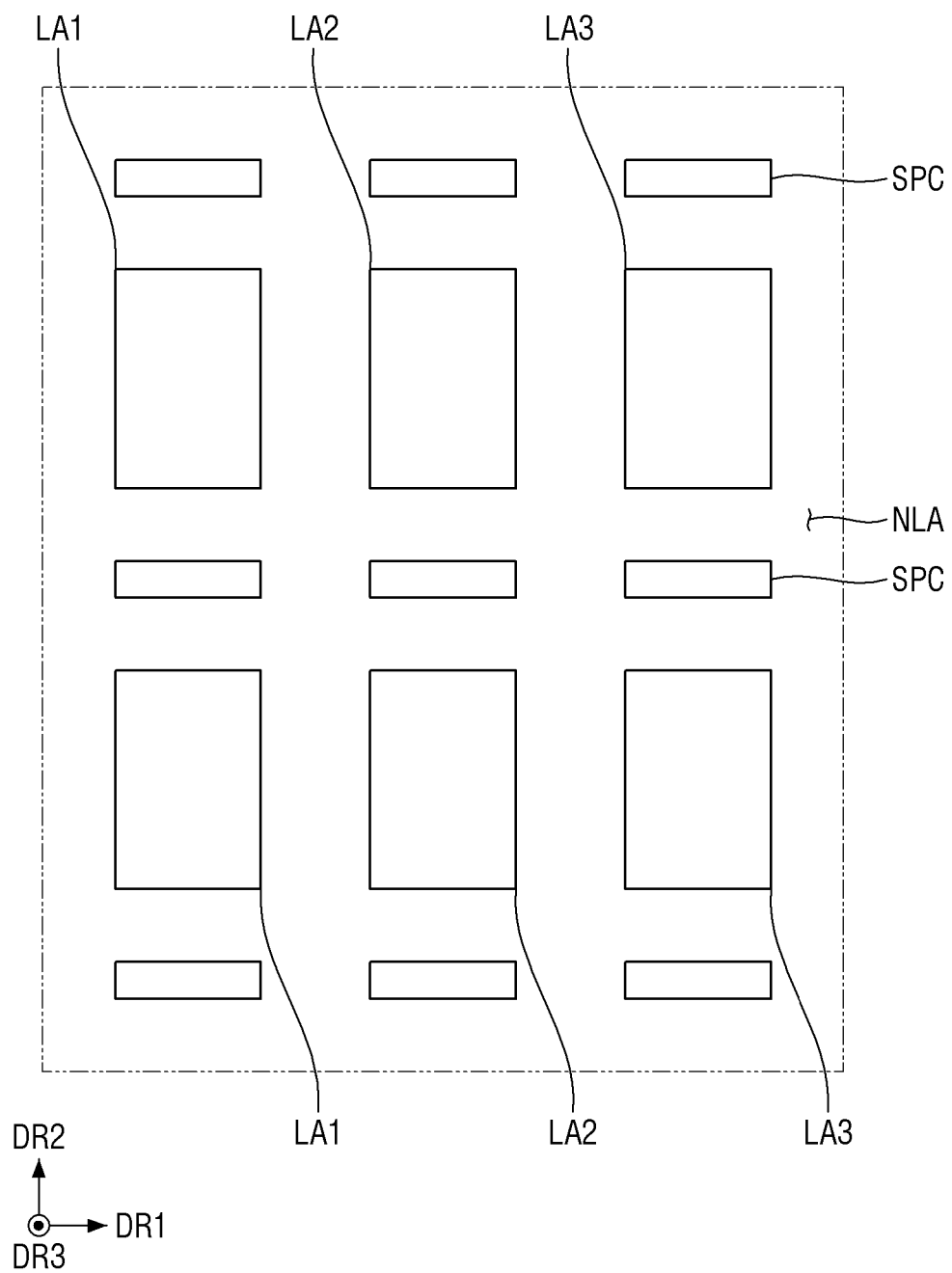
FIGS. 10 to 13 are plan views illustrating emission areas and spacers of display devices according to other embodiments, respectively.

Referring to FIG. 10, in another embodiment, the spacers SPC may be disposed between the emission areas LA1, LA2, and LA3 emitting the same color. Specifically, the spacer SPC may be disposed between the first emission area LA1 and another first emission area LA1 disposed adjacent to the first emission area LA1 in the second direction DR2, may be disposed between the second emission area LA2 and another second emission area LA2 disposed adjacent to the second emission area LA2 in the second direction DR2, and may be disposed between the third emission area LA3 and another third emission area LA3 disposed adjacent to the third emission area LA3 in the second direction DR2.

In addition, the spacer SPC may be disposed between any one emission area and an emission area adjacent to any one emission area in a length direction. In an embodiment, the spacer SPC may be disposed between the first emission area LA1 and another first emission area LA1 adjacent to the first emission area LA1 in the length direction, for example. In addition, the spacer SPC may be disposed between any one emission area and an emission area having a large interval, of emission areas adjacent to any one emission area. In an embodiment, the spacer SPC may be formed between the first emission area LA1 and another first emission area LA1 having a relatively large interval, of a second emission area LA2 and another first emission area LA1 adjacent to the first emission area LA1, for example.

Figure 11:
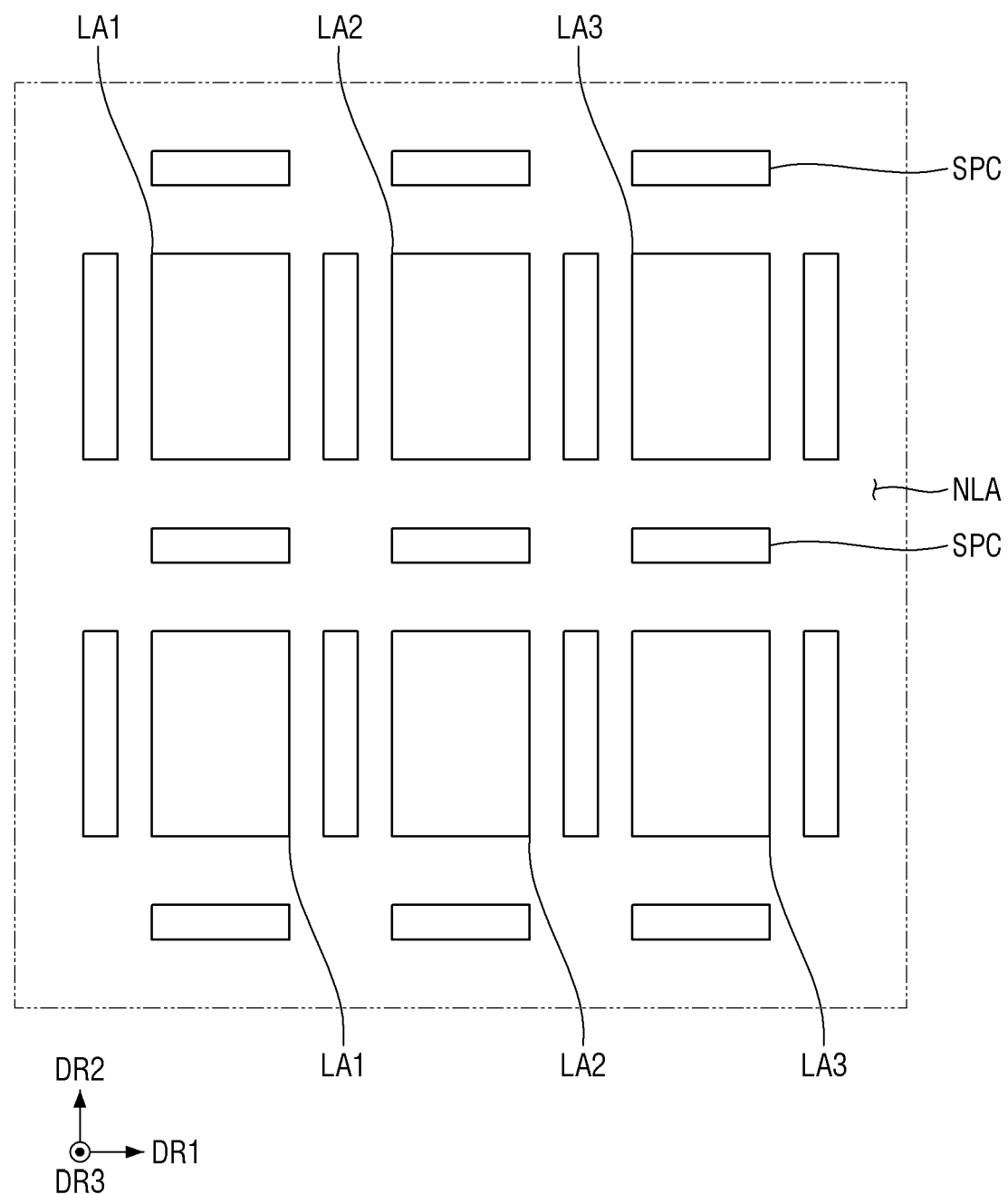

Referring to FIG. 11, in another embodiment, the spacers SPC may be disposed to surround each of the emission areas LA1, LA2, and LA3 in a plan view. The spacers SPC may be disposed to correspond to sides of each of the emission areas LA1, LA2, and LA3. In an embodiment, the spacers SPC may be disposed on the upper side, the lower side, the left side, and the right side of the first emission area LA1 in a plan view, respectively, for example.

In addition, the spacers SPC may be disposed between the emission areas LA1, LA2, and LA3 adjacent to each other, respectively. In an embodiment, the spacers SPC may be disposed between the first emission area LA1 and the second emission area LA2 adjacent to each other, between the third emission area LA3 and the second emission area LA2 adjacent each other, and between the second emission area LA2 and other second emission areas LA2 each adjacent to the second emission area LA2 in the second direction DR2, for example.

Figure 12:
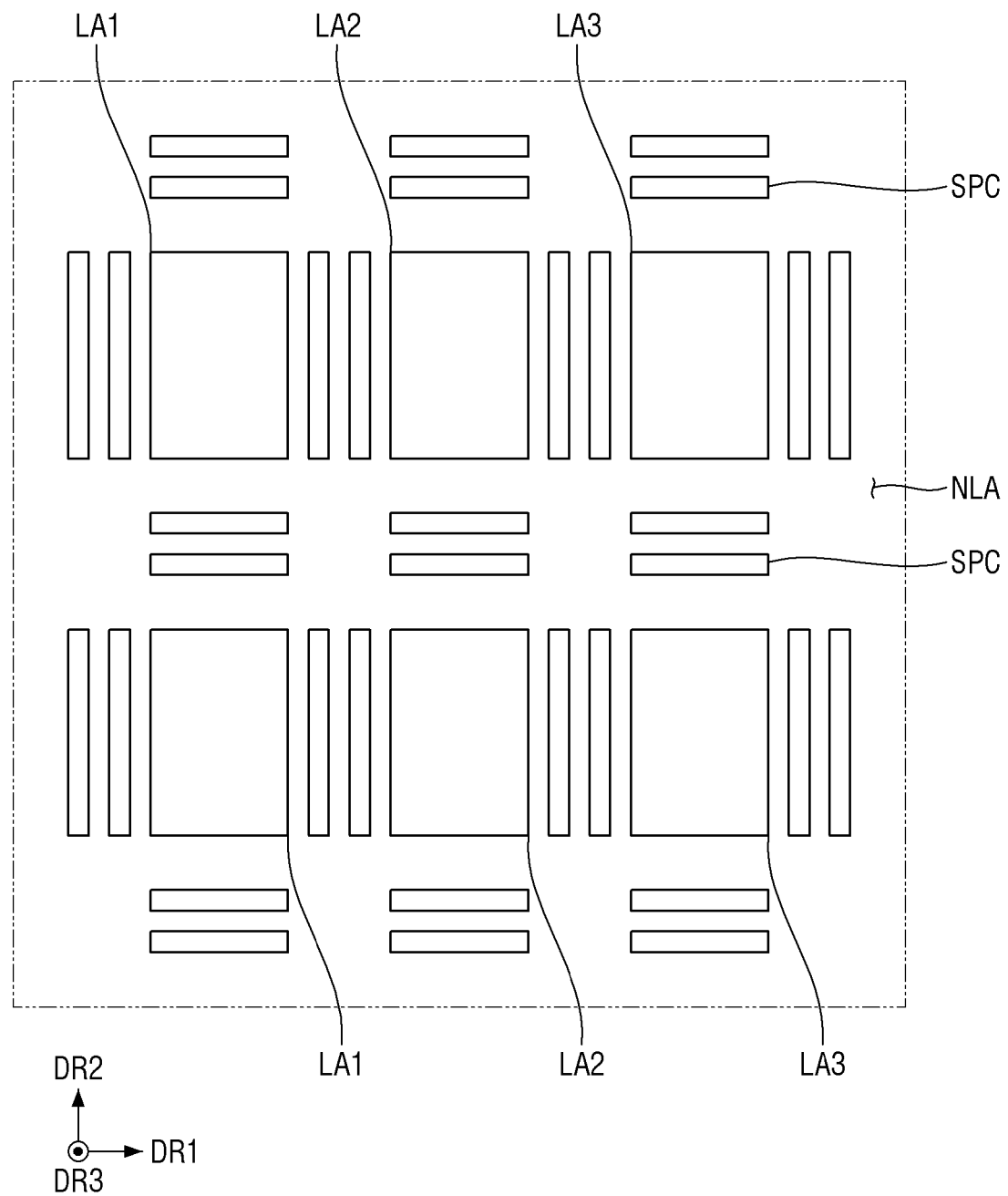
Figure 13:
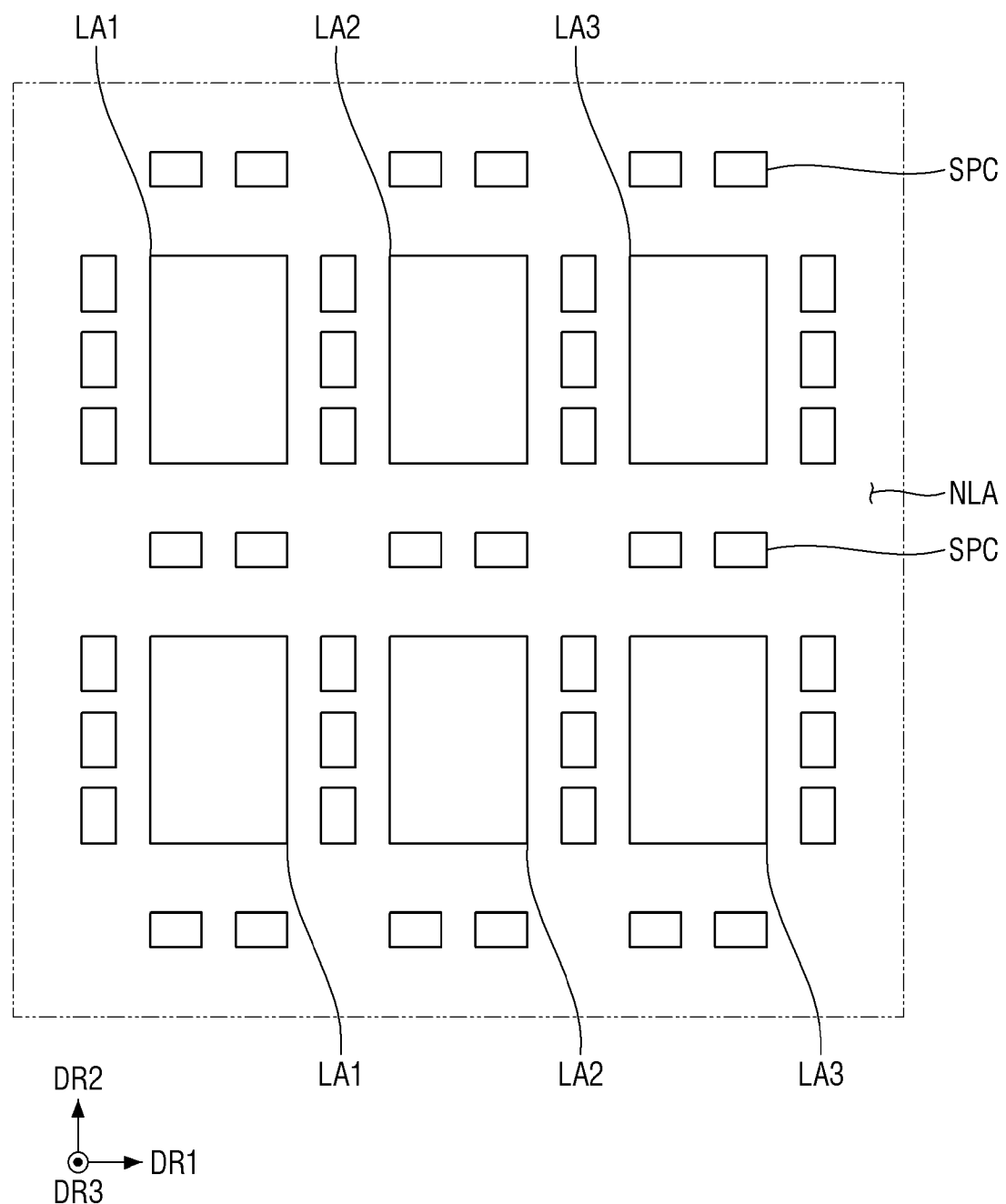

Referring to FIGS. 12 and 13, two or more spacers SPC may be disposed between the respective emission areas LA1, LA2, and LA3.

As illustrated in FIG. 12, two spacers SPC may be disposed between the first emission area LA1 and the second emission area LA2, and two spacers SPC may be disposed between the first emission area LA1 and another first emission area LA1.

The spacers SPC disposed adjacent to each other may have the same length in the first direction DR1 or the second direction DR2. The disclosure is not limited thereto, and the spacers SPC disposed adjacent to each other may have different lengths in the first direction DR1 or the second direction DR2. In an embodiment, a length, in the second direction DR2, of a spacer SPC adjacent to the first emission area LA1, of the spacers SPC disposed between the first emission area LA1 and the second emission area LA2 may be greater or smaller than a length, in the second direction DR2, of a spacer SPC adjacent to the second emission area LA2, of the spacers SPC disposed between the first emission area LA1 and the second emission area LA2, for example.

The spacers SPC disposed adjacent to each other may be disposed to be spaced apart from each other by a predetermined interval. This interval is not limited, but may be adjusted in consideration of an interval between the first emission area LA1 and the second emission area LA2. In addition, three or more spacers SPC may also be disposed adjacent to each other within the interval between the first emission area LA1 and the second emission area LA2.

As illustrated in FIG. 13, in another embodiment, the spacers SPC may be divided into a plurality of spacers. In an embodiment, the spacer SPC disposed between the first emission area LA1 and the second emission area LA2 may be divided into three spacers along the second direction DR2, for example. In addition, the spacer SPC disposed between first emission areas LA1 adjacent to each other may be divided into two spacers along the first direction DR1. In this case, intervals between the divided spacers SPC may be equal to or different from each other. In addition, lengths of the divided spacers SPC may be equal to or different from each other.

Hereinafter, a method for manufacturing the display device described above will be described.

FIGS. 14 to 18 are cross-sectional views illustrating an embodiment of processes of a method for manufacturing the display device.

FIGS. 14 to 18 may correspond to the cross-sectional view of the display device illustrated in FIG. 7. In a description of a method for manufacturing the display device to be provided below, materials of the respective layers has been described above, and a description thereof will thus be omitted.

Figure 14:
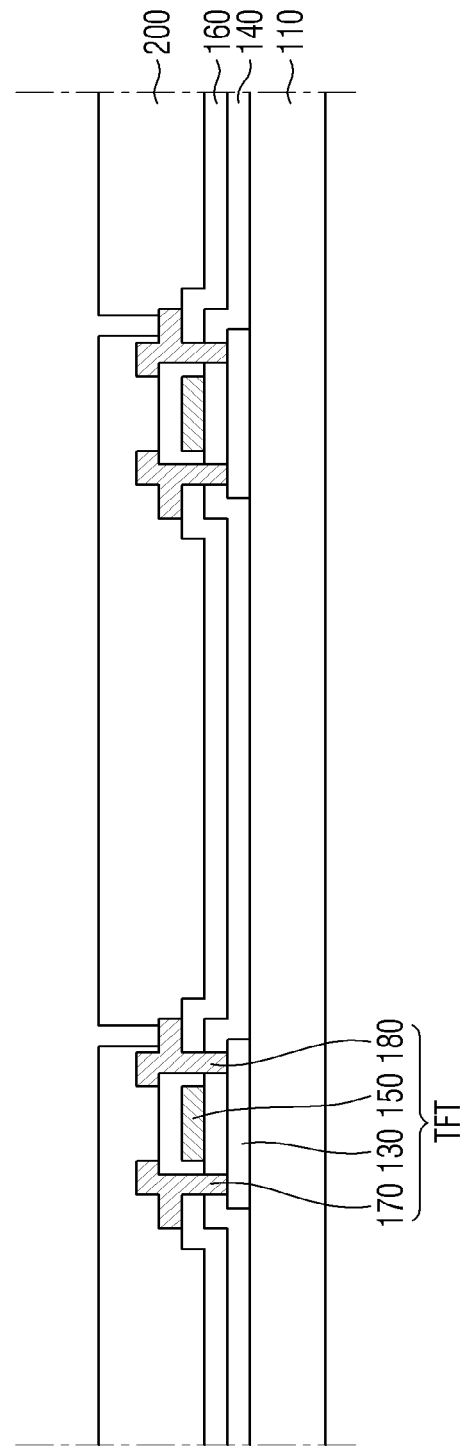
FIGS. 14 to 18 are cross-sectional views illustrating an embodiment of processes of a method for manufacturing the display device.

Referring to FIG. 14, the active layers 130 may be formed on the substrate 110. The active layers 130 may be formed by a mask process. In an embodiment, the active layers 130 as illustrated in FIG. 14 may be formed by depositing an oxide semiconductor or silicon on the substrate 110 and then patterning the oxide semiconductor or the silicon through a photolithography process, for example.

Next, the gate insulating layer 140 is formed on the active layers 130, and the gate electrodes 150 overlapping the active layers 130 are formed on the gate insulating layer 140. The gate electrodes 150 may be formed by a mask process. In an embodiment, a gate electrode material layer is entirely deposited on the gate insulating layer 140, for example. Next, a photoresist layer is applied onto the gate electrode material layer, a photoresist pattern is formed by exposing and developing the photoresist layer, and the gate electrode material layer is then etched using the photoresist pattern as an etching mask. Next, the photoresist pattern may be removed through a strip or ashing process to form the gate electrodes 150.

Next, the inter-insulating layer 160 is formed on the gate electrodes 150, and the source electrodes 170 and the drain electrodes 180 are formed on the inter-insulating layer 160. The source electrodes 170 and the drain electrodes 180 may be formed through the mask process described above.

Before the source electrodes 170 and the drain electrodes 180 are formed, contact holes penetrating through the inter-insulating layer 160 and the gate insulating layer 140 to expose the active layers 130 are formed. Next, a source/drain electrode material layer is entirely deposited on the inter-insulating layer 160 and patterned through a photolithography process to form the source electrodes 170 and the drain electrodes 180. The source electrodes 170 and the drain electrodes 180 may be connected to the active layers 130 through the contact holes. Accordingly, the thin film transistors TFT including the active layers 130, the gate electrodes 150, the source electrodes 170, and the drain electrodes 180 are manufactured.

Next, the planarization layer 200 is formed on the source electrodes 170 and the drain electrodes 180. The planarization layer 200 may be formed by coating an organic material through a solution process, e.g., a process such as spin coating. Next, via holes exposing the drain electrodes 180 of the thin film transistors TFT are formed through a photolithography process.

Figure 15:
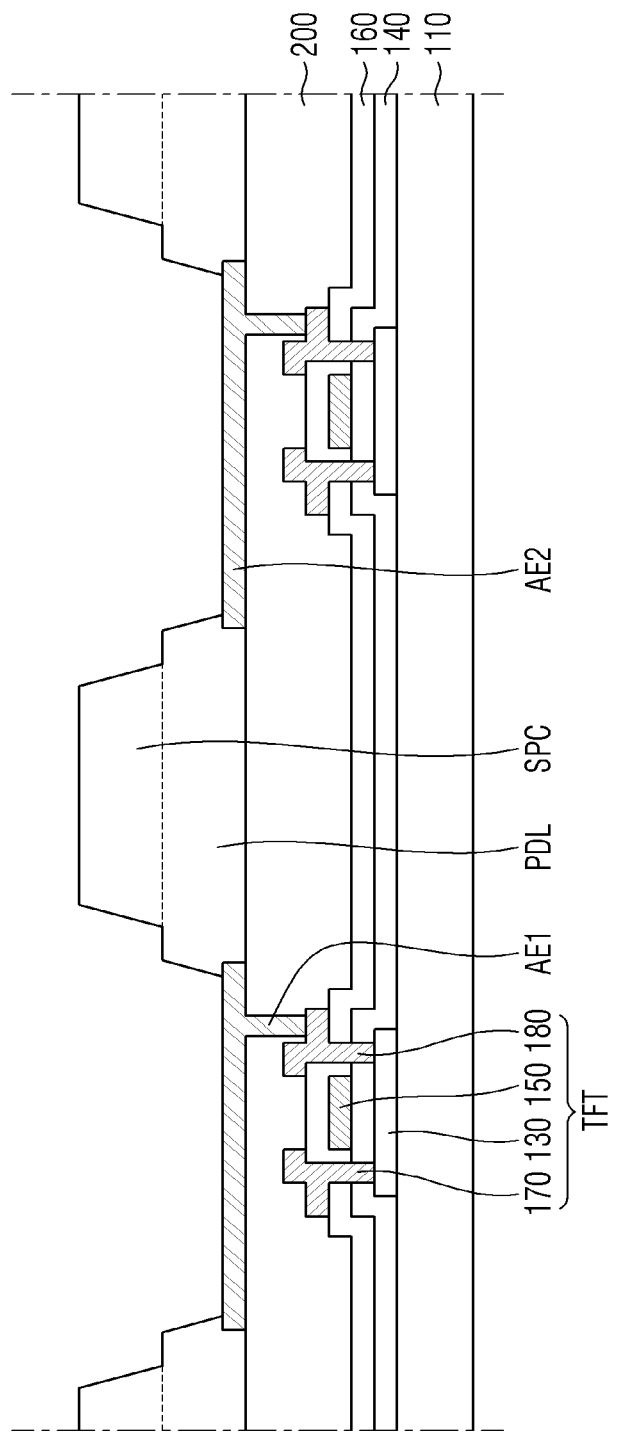

Next, referring to FIG. 15, the anode electrodes AE1 and AE2 are formed. The anode electrodes AE1 and AE2 may be formed by physical vapor deposition ("PVD") or chemical vapor deposition ("CVD").

Next, an organic material layer is applied onto the planarization layer 200 on which the anode electrodes AE1 and AE2 are formed, and the pixel defining film PDL and the spacer SPC are formed through a photolithography process using a halftone mask. The pixel defining film PDL and the spacer SPC may be simultaneously formed through the same process.

Figure 16:
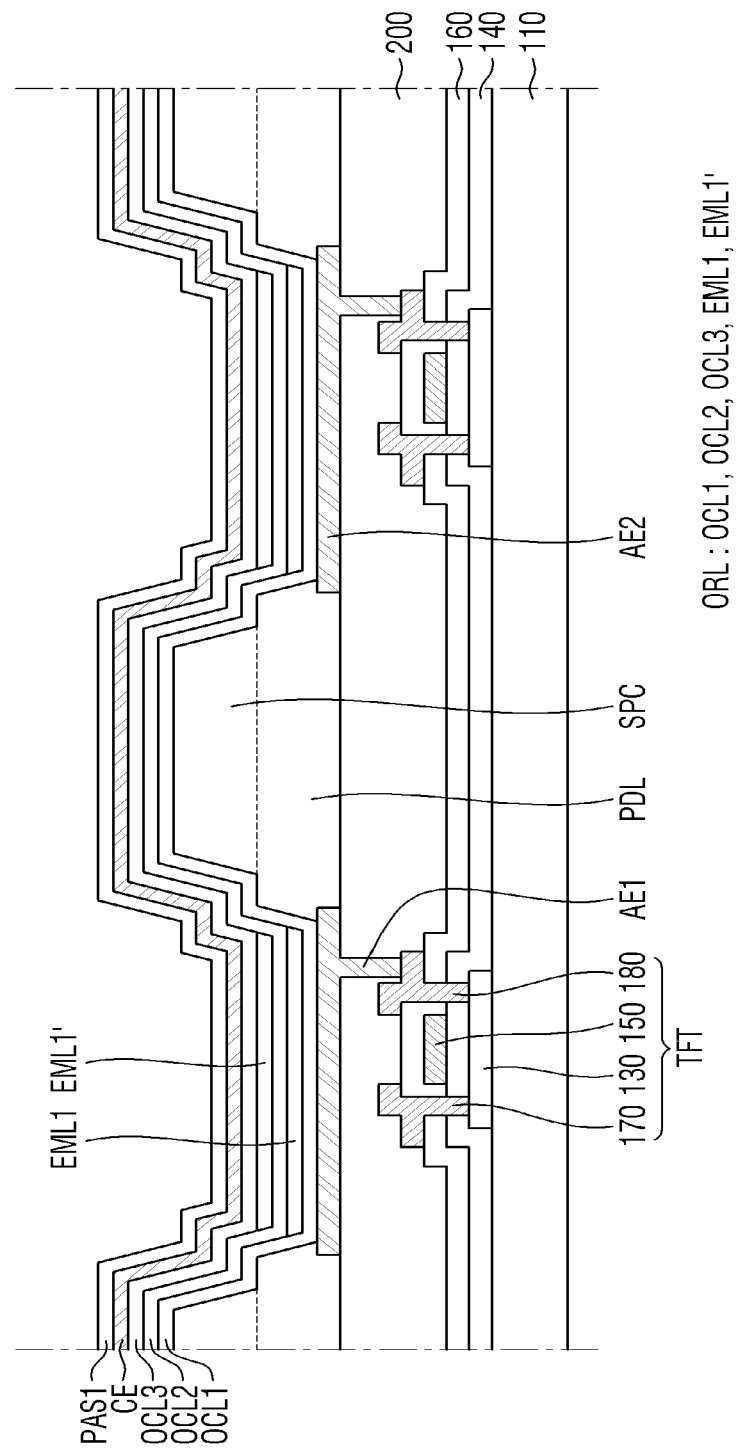

Next, referring to FIG. 16, the organic layer ORL is deposited on the substrate 110. The organic layer ORL may include the first common layer OCL1, the first lower light-emitting layer EML1, the second common layer OCL2, the second upper light-emitting layer EML1', and the third common layer OCL3 that are sequentially stacked. In addition, the first common layer OCL1, the second common layer OCL2, and the third common layer OCL3 may be entirely formed on the substrate 110. The organic layer ORL may be directly formed on the anode electrodes AE1 and AE2 of the respective emission areas LA1 and LA2, and may be directly formed on the pixel defining film PDL and the spacer SPC.

Next, the cathode electrode CE is formed on the organic layer ORL. The cathode electrode CE may be entirely formed on the organic layer ORL.

Next, the passivation layer PAS1 is formed on the cathode electrode CE. The passivation layer PAS1 may be entirely formed on the cathode electrode CE.

Figure 17:
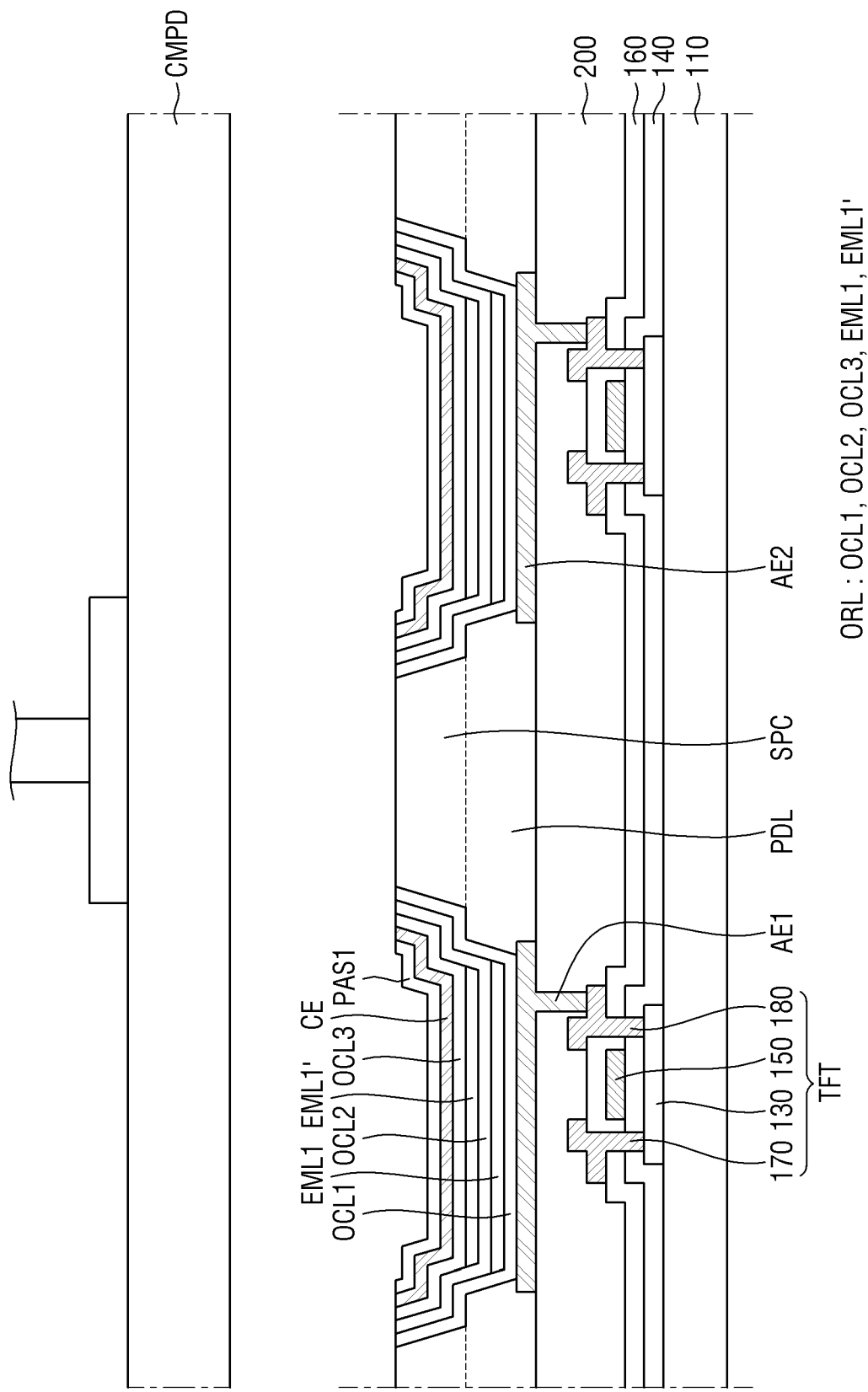

Next, referring to FIG. 17, the first common layer OCL1, the second common layer OCL2, the third common layer OCL3, the cathode electrode CE, and the passivation layer PAS1 are removed on the spacer SPC by performing a polishing process on the substrate 110 on which the passivation layer PAS1 is formed. The polishing process may be performed using a polishing device CMPD that performs a chemical mechanical polishing ("CMP") process.

In the CMP polishing process, polishing is performed in a form in which polishing slurry tears off a partial area of a substrate surface when it is adsorbed on the substrate surface and then desorbed from the substrate surface by fluidity. Therefore, when electrical properties of the substrate surface and the polishing slurry are opposite to each other at acidity of the polishing slurry, an attractive force is generated, such that polishing is easily performed and a removal rate ("RR") is increased. When using the fact that a layer that is to be removed through polishing and a layer that is not to be polished have different polarities by such characteristics, it is possible to implement a self-stop process in which etching is performed using the polishing and then, does not occur in the layer that is not to be polished.

The polishing device CMPD is aligned on the substrate 110, and then polishes objects through rotation or linear reciprocation of the polishing device CMPD. In this case, the polishing slurry is supplied onto the substrate 110 through a nozzle or the like. Objects to be polished are the first common layer OCL1, the second common layer OCL2, the third common layer OCL3, the cathode electrode CE, and the passivation layer PAS1 disposed on the spacer SPC. That is, the polishing slurry is applied onto the substrate 110 on which the passivation layer PAS1 is formed, and the first common layer OCL1, the second common layer OCL2, the third common layer OCL3, the cathode electrode CE, and the passivation layer PAS1 are polished and removed using the polishing device CMPD.

In the polishing process, the passivation layer PAS1 disposed at the uppermost portion, the cathode electrode CE, the third common layer OCL3, the second common layer OCL2, and the first common layer OCL1 may be sequentially polished and removed. When the first common layer OCL1, the second common layer OCL2, the third common layer OCL3, the cathode electrode CE, and the passivation layer PAS1 disposed on the spacer SPC are removed, the polishing device CMPD reaches the spacer SPC, but the spacer SPC is not polished, and the polishing is stopped. Accordingly, as illustrated in FIG. 17, the first common layer OCL1, the second common layer OCL2, the third common layer OCL3, the cathode electrode CE, and the passivation layer PAS1 disposed on the spacer SPC are polished and removed.

Figure 18:
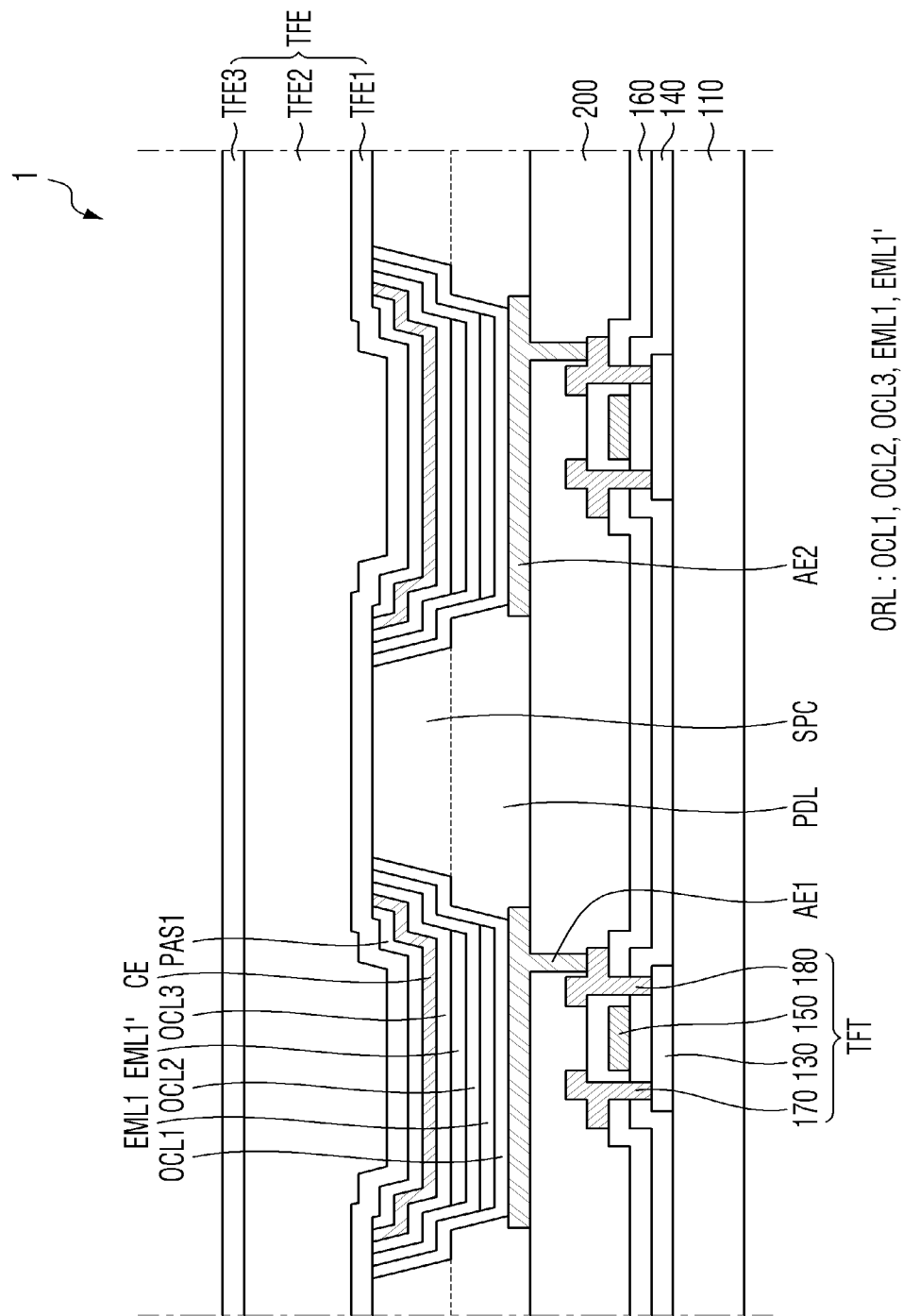

Next, referring to FIG. 18, the encapsulation layer TFE is formed by sequentially forming the first inorganic film TFE1, the organic film TFE2, and the second inorganic film TFE3 on the substrate 110 on which the polishing process has been performed.

Accordingly, the display device 1 in an embodiment of the disclosure may be manufactured. In the illustrated embodiment, after the spacer SPC is formed, the first common layer OCL1, the second common layer OCL2, the third common layer OCL3, and the cathode electrode CE, and the passivation layer PAS1 protruding from and disposed on the spacer SPC may be removed and separated through the polishing process. Therefore, by separating at least portions of the common layers acting as movement paths of charges, e.g., the first to third common layers OCL1, OCL2, and OCL3, the movement of charges to the adjacent emission areas may be reduced to improve gradation expression and color mixing of the display device 1.

Hereinafter, a display device in another embodiment will be described. Hereinafter, a description of the same configurations as those of the above-described embodiment will be omitted, and configurations different from those of the above-described embodiment will be described in detail.

Figure 19:
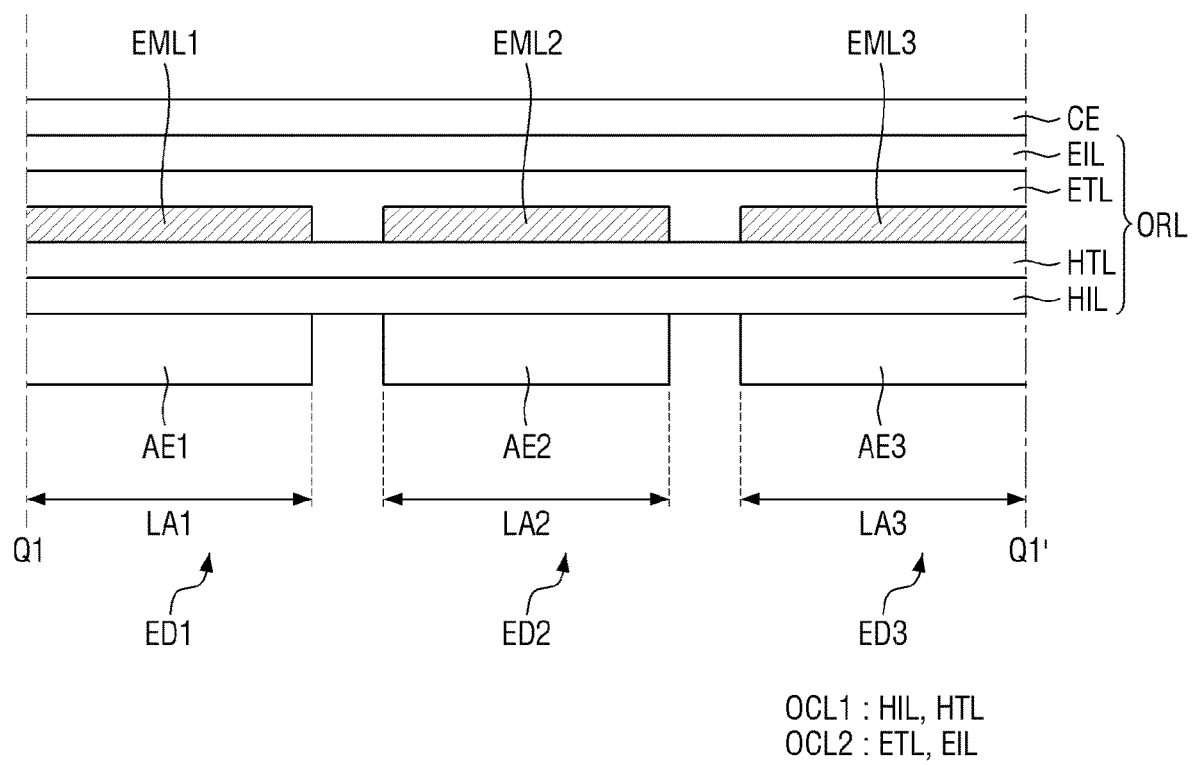
FIG. 19 is a cross-sectional view of another embodiment taken along line Q1-Q1' of FIG. 4.
Figure 20:
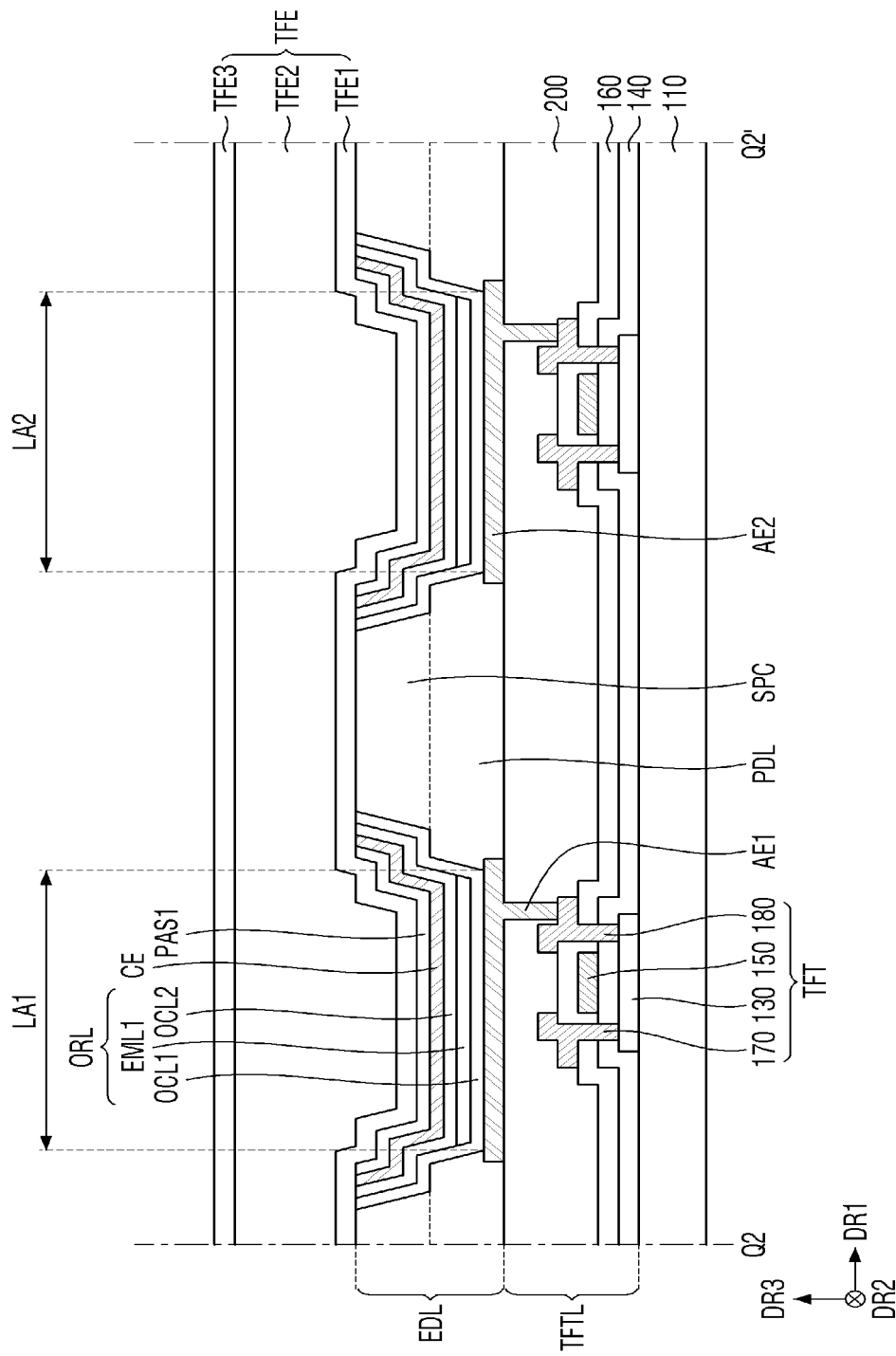
FIG. 20 is a cross-sectional view of another embodiment taken along line Q2-Q2' of FIG. 6.

FIG. 19 is a cross-sectional view of another embodiment taken along line Q1-Q1' of FIG. 4. FIG. 20 is a cross-sectional view of another embodiment taken along line Q2-Q2' of FIG. 6.

FIG. 19 schematically illustrates anode electrodes AE, an organic layer ORL, and a cathode electrode CE of organic light-emitting elements ED1, ED2, and ED3 disposed on the display device 1. FIG. 20 illustrates a cross-sectional structure between the first emission areas LA1 and the second emission areas LA2 as an example.

Referring to FIG. 19, in the illustrated embodiment, configurations of the common layers of the organic layer ORL may be different from those of FIG. 5 described above. Hereinafter, a description of contents overlapping those of the above-described embodiment will be omitted, and contents different from those of the above-described embodiment will be described.

The organic layer ORL may have a single stack structure. Specifically, the organic layer ORL may include a hole injection layer HIL, a hole transport layer HTL, an electron transport layer ETL, and an electron injection layer EIL disposed on the anode electrodes AE1, AE2, and AE3. The hole injection layer HIL, the hole transport layer HTL, the electron transport layer ETL, and the electron injection layer EIL may be common layers continuously disposed on the first anode electrode AE1, the second anode electrode AE2, and the third anode electrode AE3.

In addition, the organic layer ORL may include a first lower light-emitting layer EML1 disposed on the first anode electrode AE1, a second lower light-emitting layer EML2 disposed on the second anode electrode AE2, and a third lower light-emitting layer EML3 disposed on the third anode electrode AE3. The first lower light-emitting layer EML1, the second lower light-emitting layer EML2, and the third lower light-emitting layer EML3 may be patterned to correspond to the anode electrodes AE1, AE2, and AE3, respectively.

The hole injection layer HIL, the hole transport layer HTL, the electron transport layer ETL, and the electron injection layer EIL of the organic layer ORL described above may be disposed to be separated on the spacer SPC. Hereinafter, for convenience of explanation, the hole injection layer HIL and the hole transport layer HTL will be also referred to as a first common layer OCL1, and the electron transport layer ETL and the electron injection layer EIL will be also referred to as a second common layer OCL2.

Referring to FIG. 20, the organic layer ORL may be disposed on the anode electrodes AE1 and AE2 and the pixel defining film PDL. The organic layer ORL may include the hole injection layer HIL, the hole transport layer HTL, the electron transport layer ETL, and the electron injection layer EIL, as illustrated in FIG. 19. The first lower light-emitting layer EML1 may be disposed in the first emission area LA1, and the second lower light-emitting layer EML2 may be disposed in the second emission area LA2.

The first common layer OCL1 of the organic layer ORL may be disposed to be in direct contact with the anode electrodes AE1 and AE2, the pixel defining film PDL, and the spacer SPC. The first common layer OCL1 and the second common layer OCL2 may be disposed to be separated on the spacer SPC. In an embodiment, the first common layer OCL1 and the second common layer OCL2 may be disposed in each of the first emission area LA1 and the second emission area LA2, but may be disposed to be separated on the spacer SPC disposed between the first emission area LA1 and the second emission area LA2, for example. The first common layer OCL1 and the second common layer OCL2 may be disposed so as not to overlap an upper surface of the spacer SPC in the third direction DR3.

The first common layer OCL1 and the second common layer OCL2 may be disposed on the pixel defining film PDL in an area in which the spacer SPC is not disposed. In an embodiment, the first common layer OCL1 may be disposed to be in direct contact with the entirety of an upper surface of the pixel defining film PDL, for example. The first common layer OCL1 and the second common layer OCL2 may be continuously disposed between the first emission areas LA1.

As described above, the first common layer OCL1 and the second common layer OCL2 may be separated, respectively, in an area in which the spacer SPC is disposed, and thus, the movement of charges to adjacent emission areas LA1 and LA2 may be reduced. Accordingly, the movement of charges between the first emission area LA1 and the second emission area LA2 adjacent to each other may be reduced, such that a leakage current may be reduced.

The cathode electrode CE and the passivation layer PAS1 may be disposed on the organic layer ORL. The cathode electrode CE and the passivation layer PAS1 may also be disposed to be separated on the spacer SPC. The uppermost surfaces of the first common layer OCL1, the second common layer OCL2, the cathode electrode CE, and the passivation layer PAS1 may be aligned and coincide with each other, and may be aligned and coincide with the uppermost surface of the spacer SPC.

As described above, by separating at least portions of the first common layer OCL1 and the second common layer OCL2 between the emission areas LA1 and LA2, resistances may be increased, and accordingly, the movement of charges to the adjacent emission areas through the first common layer OCL1 and the second common layer OCL2 may be reduced to improve gradation expression and color mixing.

Figure 21:
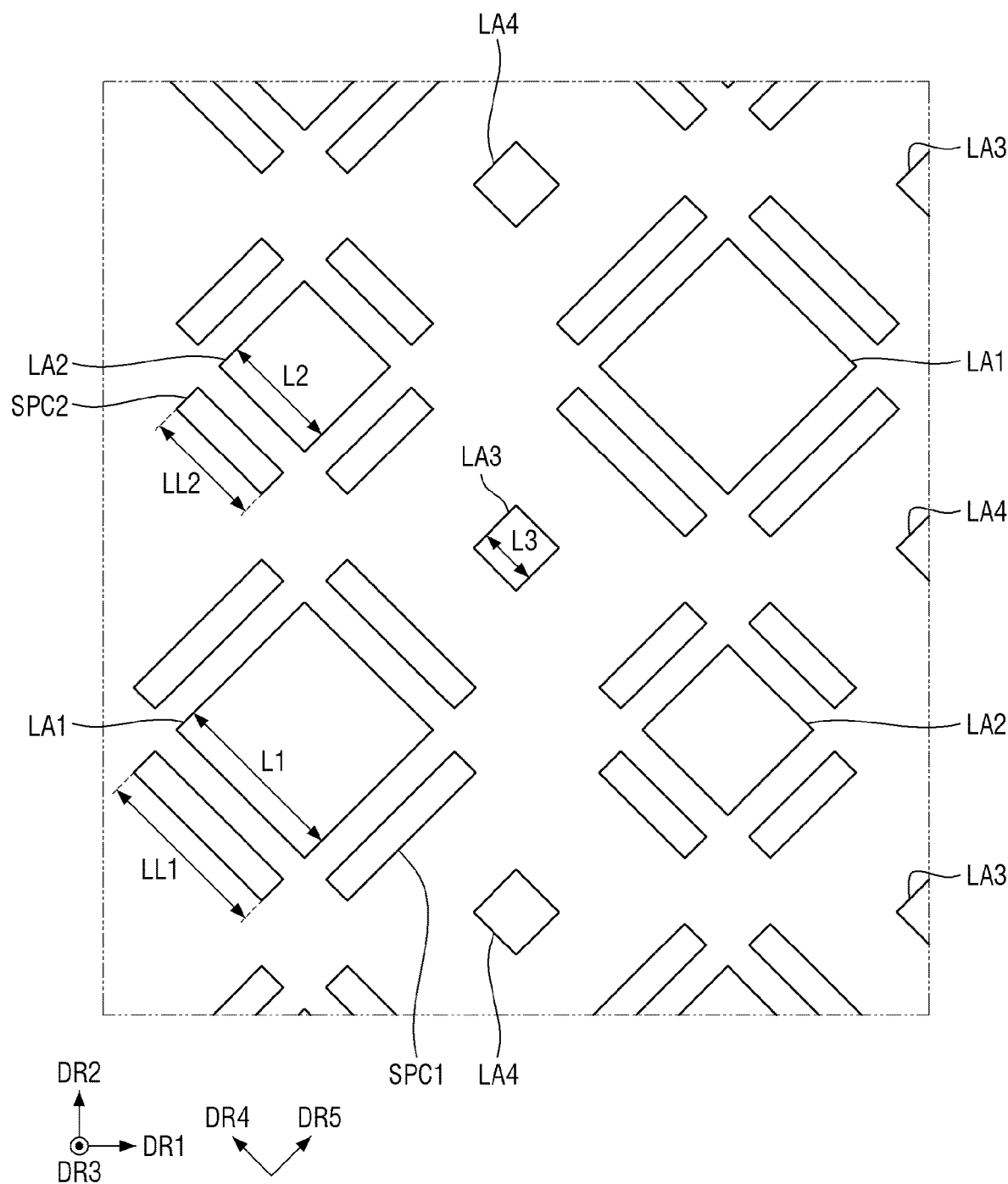
FIG. 21 is a plan view illustrating another embodiment of emission areas and spacers of a display device.

FIG. 21 is a plan view illustrating another embodiment of emission areas and spacers of a display device.

Referring to FIG. 21, the illustrated embodiment is different from the above-described embodiments in an arrangement of emission areas and a shape of spacers. Hereinafter, a description of contents overlapping those of the above-described embodiment will be omitted, and contents different from those of the above-described embodiment will be described.

The display device in another embodiment may include a first emission area LA1 emitting light of a first color, a second emission area LA2 emitting light of a second color, a third emission area LA3 emitting light of a third color, and a fourth emission area LA4 emitting the light of the third color. In an embodiment, the first color may be blue, the second color may be red, and the third color may be green, for example. It has been illustrated in FIG. 21 that the third emission area LA3 and the fourth emission area LA4 emit light of the same color, but an embodiment of the disclosure is not limited thereto. That is, the third emission area LA3 and the fourth emission area LA4 may also emit light of different colors.

The first emission area LA1 and the second emission area LA2 may neighbor to each other in the first direction DR1, and the third emission area LA3 and the fourth emission area LA4 may neighbor to each other in the second direction DR2. The first emission area LA1 and the fourth emission area LA4 may neighbor to each other in a fourth direction DR4, and the first emission area LA1 and the third emission area LA3 may neighbor to each other in a fifth direction DR5. The fourth direction DR4 may be a direction between the first direction DR1 and the second direction DR2, and may be a direction inclined by about 45° with respect to the second direction DR2. The fifth direction DR5 may be a direction perpendicular to the fourth direction DR4.

Each of the first emission area LA1, the second emission area LA2, the third emission area LA3, and the fourth emission area LA4 may have a quadrangular shape (e.g., rhombic shape or a rectangular shape) in a plan view, but is not limited thereto. Each of the first emission area LA1, the second emission area LA2, the third emission area LA3, and the fourth emission area LA4 may have polygonal shapes other than the quadrangular (e.g., rectangular) shape, a circular shape, or an elliptical shape in a plan view. In addition, it has been illustrated in FIG. 21 that the first emission area LA1 has the greatest area and the third emission area LA3 and the fourth emission area LA4 have the smallest area, but the disclosure is not limited thereto.

The first emission areas LA1 and the second emission areas LA2 may be disposed in even-numbered rows. The first emission areas LA1 and the second emission areas LA2 may be disposed side by side in the first direction DR1 in each of the even-numbered rows. The first emission areas LA1 and the second emission areas LA2 may be alternately disposed in each of the even-numbered rows. The first emission areas LA1 and the second emission areas LA2 may be disposed in odd-numbered columns. The first emission areas LA1 and the second emission areas LA2 may be disposed side by side in the second direction DR2 in each of the odd-numbered columns. The first emission areas LA1 and the second emission areas LA2 may be alternately disposed in each of the odd-numbered columns.

The third emission areas LA3 and the fourth emission areas LA4 may be disposed in odd-numbered rows. The third emission areas LA3 and the fourth emission areas LA4 may be disposed side by side in the first direction DR1 in each of the odd-numbered rows. The third emission areas LA3 and the fourth emission areas LA4 may be alternately disposed in each of the odd-numbered rows. The third emission areas LA3 and the fourth emission areas LA4 may be disposed in even-numbered columns. The third emission areas LA3 and the fourth emission areas LA4 may be disposed side by side in the second direction DR2 in each of the even-numbered columns. The third emission areas LA3 and the fourth emission areas LA4 may be alternately disposed in each of the even-numbered columns.

In another embodiment, spacers SPC may be disposed between the respective emission areas LA1, LA2, LA3, and LA4.

The spacers SPC may be disposed between the respective emission areas LA1, LA2, LA3, and LA4 so as not to overlap the emission areas LA1, LA2, LA3, and LA4. The spacers SPC may be disposed in the non-emission area NLA other than the emission areas LA1, LA2, LA3, and LA4. In another embodiment, the spacers SPC may be disposed between emission areas adjacent to each other among the emission areas LA1, LA2, LA3, and LA4. In an embodiment, the spacers SPC may be disposed between the first emission area LA1 and the third emission area LA3 adjacent to the first emission area LA1 in the fifth direction DR5, between the first emission area LA1 and the fourth emission area LA4 adjacent to the first emission area LA1 in the fourth direction DR4, between the first emission area LA1 and the third emission area LA3 adjacent to the first emission area LA1 in an opposite direction to the fifth direction DR5, between the first emission area LA1 and the fourth emission area LA4 adjacent to the first emission area LA1 in an opposite direction to the fourth direction DR4, for example. That is, the spacers SPC may be disposed between the adjacent emission areas to which charges easily move through the common layers, such that the common layers may be disposed to be separated.

At least one spacer SPC may be disposed between the respective emission areas LA1, LA2, LA3, and LA4. In an embodiment, one spacer SPC may be disposed between the first emission area LA1 and the third emission area LA3, for example. The spacer SPC disposed between the first emission area LA1 and the third emission area LA3 may be disposed parallel to at least one sides of the adjacent first emission area LA1 and/or third emission area LA3.

The spacers SPC may include first spacers SPC1 and second spacers SPC2. The first spacers SPC1 may be disposed adjacent to the first emission area LA1, and the second spacers SPC2 may be disposed adjacent to the second emission area LA2. The first spacers SPC1 may be disposed to surround the first emission area LA1. In an embodiment, the first spacers SPC1 may be disposed to correspond to four sides of the first emission area LA1, respectively, for example. The second spacers SPC2 may be disposed to surround the second emission area LA2. In an embodiment, the second spacers SPC2 may be disposed to correspond to four sides of the second emission area LA2, respectively, for example.

The third emission area LA3 and the fourth emission area LA4 may be surrounded by the first spacers SPC1 and the second spacers SPC2. In an embodiment, two sides of each of the third emission area LA3 and the fourth emission area LA4 facing each other in the fourth direction DR4 may be surrounded by the first spacers SPC1 or second spacers SPC2, and two sides of each of the third emission area LA3 and the fourth emission area LA4 facing each other in the fifth direction DR5 may be surrounded by the first spacers SPC1 or the second spacers SPC2, for example.

Each of the first spacer SPC1 and the second spacer SPC2 may have a length measured in the fourth direction DR4 or the fifth direction DR5. The first spacer SPC1 may have a first length LL1, and the second spacer SPC2 may have a second length LL2. The first length LL1 of the first spacer SPC1 may be equal to a length L1 of one side of the first emission area LA1, and the second length LL2 of the second spacer SPC2 may be equal to a length L2 of one side of the emission area LA2. However, the disclosure is not limited thereto, and the first length LL1 of the first spacer SPC1 may be greater or smaller than the length L1 of one side of the first emission area LA1, and the second length LL2 of the second spacer SPC2 may be 2 may be greater or smaller than the length L2 of one side of the emission area LA2.

The first length LL1 of the first spacer SPC1 may be greater than the length L2 of one side of the second emission area LA2 and be greater than the second length LL2 of the second spacer SPC2. In addition, the first length LL1 of the first spacer SPC1 may be greater than a length L3 of one sides of the third and fourth emission areas LA3 and LA4. The second length LL2 of the second spacer SPC2 may be smaller than the length L1 of one side of the first emission area LA1, and may be greater than the length L3 of one sides of the third emission area LA3 and the fourth emission area LA4.

It has been illustrated in FIG. 21 that the first length LL1 of the first spacer SPC1 and the second length LL2 of the second spacer SPC2 are different from each other, but the disclosure is not limited thereto, and the first length LL1 of the first spacer SPC1 and the second length LL2 of the second spacer SPC2 may be equal to each other. In addition, it has been illustrated that the spacers SPC are disposed between the first emission area LA1, the second emission area LA2, the third emission area LA3, and the fourth emission area LA4, but the disclosure is not limited thereto, and one or more of the spacers SPC may be omitted.

As described above, by disposing the spacers SPC between the respective emission areas LA1, LA2, LA3, and LA4, the common layers of the organic layer ORL described above may be separated on the spacer SPC. Accordingly, paths of leakage currents moving to the adjacent emission areas through the common layers may be increased to increase resistances, and accordingly, the movement of charges to the adjacent emission areas may be reduced to improve gradation expression and color mixing.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a substrate;
   first electrodes disposed on the substrate;
   a pixel defining film covering edges of the first electrodes;
   a spacer disposed on the pixel defining film and disposed between the first electrodes;
   an organic layer disposed on the first electrodes, the pixel defining film, and the spacer; and
   a second electrode disposed on the organic layer, the organic layer including:
      a first common layer and a second common layer continuously disposed on the first electrodes,
   wherein
   the first common layer, the second common layer, and the second electrode do not overlap the spacer.

2. The display device of claim 1, wherein the spacer is unitary with the pixel defining film and protrudes in a thickness direction of the pixel defining film.

3. The display device of claim 1, wherein the spacer does not overlap the first electrodes.

4. The display device of claim 1, wherein the first common layer includes a hole injection layer and a hole transport layer, and the second common layer includes an electron transport layer and an electron injection layer.

5. The display device of claim 4, wherein the organic layer includes a light-emitting layer disposed between the first common layer and the second common layer and overlapping the first electrodes.

6. The display device of claim 1, wherein an uppermost surface of each of the first common layer, the second common layer, and the second electrode is aligned and coincides with an upper surface of the spacer.

7. The display device of claim 1, further comprising a passivation layer disposed on the second electrode,
   wherein the passivation layer does not overlap an upper surface of the spacer.

8. The display device of claim 7, wherein an uppermost surface of each of the first common layer, the second common layer, the second electrode, and the passivation layer is aligned and coincides with the upper surface of the spacer.

9. The display device of claim 7, further comprising an encapsulation layer disposed on the passivation layer and including a first inorganic film, a second inorganic film, and an organic film disposed between the first inorganic film and the second inorganic film,
   wherein the first inorganic film contacts the upper surface of the spacer.

10. The display device of claim 9, wherein an uppermost surface of each of the first common layer, the second common layer, the second electrode, and the passivation layer contacts the first inorganic film.

11. A display device comprising:
    a substrate;
    first electrodes disposed on the substrate;
    a pixel defining film covering edges of the first electrodes and defining a plurality of emission areas;
    a spacer disposed on the pixel defining film and disposed between emission areas adjacent to each other among the plurality of emission areas;
    an organic layer disposed on the first electrodes, the pixel defining film, and the spacer; and
    a second electrode disposed on the organic layer, the organic layer including:
       a first common layer and a second common layer continuously disposed on the first electrodes,
    wherein
    each of the first common layer, the second common layer, and the second electrode is separated on the spacer.

12. The display device of claim 11, wherein the spacer is disposed parallel to one side of an emission area among the plurality of emission areas, and a length of the spacer is equal to a length of one side of the emission area.

13. The display device of claim 11, wherein the spacer is provided in plural, and spacers surround the emission areas in a plan view, respectively.

14. The display device of claim 11, wherein the plurality of emission areas emits light of different colors, and the spacer is disposed between the emission areas emitting the light of the different colors.

15. The display device of claim 11, wherein the spacers do not overlap the plurality of emission areas, and are spaced apart from each other.

16. The display device of claim 11, wherein an uppermost surface of each of the first common layer, the second common layer, and the second electrode is aligned and coincides with an upper surface of the spacer.

17. The display device of claim 11, further comprising a passivation layer disposed on the second electrode,
    wherein the passivation layer does not overlap an upper surface of the spacer.

18. The display device of claim 17, wherein an uppermost surface of each of the first common layer, the second common layer, the second electrode, and the passivation layer is aligned and coincides with the upper surface of the spacer.

19. The display device of claim 17, further comprising an encapsulation layer disposed on the passivation layer and including a first inorganic film, a second inorganic film, and an organic film disposed between the first inorganic film and the second inorganic film,
    wherein the first inorganic film contacts the upper surface of the spacer.

20. The display device of claim 19, wherein an uppermost surface of each of the first common layer, the second common layer, the second electrode, and the passivation layer contacts the first inorganic film.

21. A method for manufacturing a display device, the method comprising:
    forming first electrodes on a substrate;
    forming a pixel defining film covering edges of the first electrodes and a spacer on the pixel defining film;
    forming an organic layer by sequentially stacking a first common layer, a light-emitting layer, and a second common layer on the first electrodes, the pixel defining film, and the spacer;
    forming a second electrode on the organic layer;
    forming a passivation layer on the second electrode; and
    aligning a polishing device on the substrate and polishing and removing the first common layer, the second common layer, the second electrode, and the passivation layer disposed in an area overlapping the spacer.

22. The method for manufacturing a display device of claim 21, wherein the pixel defining film and the spacer are simultaneously formed by applying an organic material layer on the substrate and using a halftone mask.

23. The method for manufacturing a display device of claim 21, wherein the first common layer, the second common layer, the second electrode, and the passivation layer are continuously formed on the first electrodes, and the passivation layer, the second electrode, the second common layer, and the first common layer are sequentially polished and removed by the polishing device.

24. The method for manufacturing a display device of claim 21, wherein polishing is stopped when the polishing device reaches the spacer.

25. The method for manufacturing a display device of claim 21, wherein the polishing is a chemical mechanical polishing process.

* * * * *